US012754249B2

(12) United States Patent
Fam

(10) Patent No.: US 12,754,249 B2
(45) Date of Patent: Oct. 6, 2026

(54) BATTERY BALANCING APPARATUS USING PIEZOELECTRIC TRANSFORMERS AND RELATED DEVICE

(71) Applicant: Huawei Digital Power Technologies Co., Ltd., Shenzhen (CN)

(72) Inventor: Kuet Liong Fam, Shenzhen (CN)

(73) Assignee: Huawei Digital Power Technologies Co., Ltd., Shenzhen (CN)

(*) Notice: Subject to any disclaimer, the term of this patent is extended or adjusted under 35 U.S.C. 154(b) by 804 days.

(21) Appl. No.: 18/187,035

(22) Filed: Mar. 21, 2023

(65) Prior Publication Data

US 2023/0305074 A1 Sep. 28, 2023

(30) Foreign Application Priority Data

Mar. 23, 2022 (CN) ......................... 202210288720.7

(51) Int. Cl.

| | |
|---|---|
| ***G01R 31/392*** | (2019.01) |
| ***G01R 31/396*** | (2019.01) |
| ***H02J 7/56*** | (2026.01) |
| ***H02J 7/84*** | (2026.01) |

(52) U.S. Cl.

CPC ......... *G01R 31/392* (2019.01); *G01R 31/396* (2019.01); *H02J 7/56* (2026.01); *H02J 7/84* (2026.01)

(58) Field of Classification Search

CPC ....... G01R 31/392; G01R 31/396; H02J 7/56; H02J 7/84; H02J 7/52; H02J 2207/20; H02J 7/0014; H02J 7/0018; H02J 7/0019

See application file for complete search history.

(56) References Cited

U.S. PATENT DOCUMENTS

| | | | | |
|---|---|---|---|---|
| 5,329,682 | A | 7/1994 | Thurn et al. | |
| 7,612,537 | B2 * | 11/2009 | Wynne .................. | H02J 7/0016 320/136 |
| 8,541,979 | B2 * | 9/2013 | Firehammer ......... | H02J 7/0014 320/135 |
| 8,766,597 | B2 | 7/2014 | Nork et al. | |

(Continued)

FOREIGN PATENT DOCUMENTS

| | | | | |
|---|---|---|---|---|
| CN | 211296261 U | * | 8/2010 | |
| WO | WO-2013114757 A1 | * | 8/2013 | ............ H02J 7/0018 |
| WO | WO-2022200241 A1 | * | 9/2022 | ......... G01N 29/4472 |

*Primary Examiner* — Jared Fureman

(74) *Attorney, Agent, or Firm* — Maier & Maier, PLLC

(57) ABSTRACT

A battery assisting apparatus and a related device. The battery assisting apparatus includes a piezoelectric transformer group which includes N piezoelectric transformers and a drive circuit group which includes N drive circuits. Respective output ends of the N drive circuits are connected to respective input ends of the N piezoelectric transformers in a one-to-one correspondence, and respective output ends of the N piezoelectric transformers are connected to N battery cells in a battery string. M drive circuits in the N drive circuits are configured to respectively output first pulse signals to M piezoelectric transformers in the N piezoelectric transformers. Each of the M piezoelectric transformers is configured to receive the first pulse signal, and output, driven by the first pulse signal, electric energy to a battery cell corresponding to each piezoelectric transformer for charging, so that voltages of the N battery cells are consistent.

11 Claims, 10 Drawing Sheets

(56) References Cited

U.S. PATENT DOCUMENTS

| | | | | |
|---|---|---|---|---|
| 10,003,194 | B2 * | 6/2018 | Fornage | H02J 7/0063 |
| 10,429,450 | B2 * | 10/2019 | Lee | G01R 31/396 |
| 10,581,124 | B2 * | 3/2020 | Nakatsuka | H02J 7/0063 |
| 2004/0135546 | A1 * | 7/2004 | Chertok | B60L 58/18 320/118 |
| 2004/0257042 | A1 * | 12/2004 | Liu | H02J 7/0018 320/130 |
| 2011/0309795 | A1 * | 12/2011 | Firehammer | H01M 10/4207 320/118 |
| 2013/0099746 | A1 * | 4/2013 | Nork | H01M 10/425 320/118 |
| 2016/0118789 | A1 * | 4/2016 | Fornage | H02J 7/0063 307/52 |
| 2018/0164383 | A1 * | 6/2018 | Hsieh | H01M 10/486 |
| 2019/0072614 | A1 * | 3/2019 | Steingart | G01N 29/4481 |
| 2022/0115876 | A1 * | 4/2022 | Wiemeyer | H02J 7/0014 |

* cited by examiner

BATTERY BALANCING APPARATUS USING PIEZOELECTRIC TRANSFORMERS AND RELATED DEVICE

CROSS-REFERENCE TO RELATED APPLICATION

This application claims priority to Chinese Patent Application No. 202210288720.7, filed on Mar. 23, 2022, which is hereby incorporated by reference in its entirety.

TECHNICAL FIELD

The embodiments relate to the field of battery technologies, a battery assisting apparatus, and a related device.

BACKGROUND

In recent years, with the rapid development of mobile electronics and electric vehicles, related battery technologies have also been developed rapidly. As a very critical technology, battery balancing can not only prolong a lifespan of a battery, but also improve performance of the battery.

Battery balancing may include active balancing and passive balancing. At present, most battery balancing technologies adopt passive balancing. The passive balancing has an advantage of low cost, but a working principle of the passive balancing is actually that a balanced battery unit releases excess charges, which causes a waste of a battery capacity. The active balancing can reallocate charges in a battery cell. Although the active balancing can avoid a waste of a battery capacity, a circuit structure of the active balancing is complex. There are many components, and costs are high.

SUMMARY

The embodiments may provide a battery assisting apparatus and a related device, to reduce a circuit area occupied by battery balancing, and achieve lightweight battery balancing.

The battery assisting apparatus provided in the embodiments may be applied to an electronic device including a plurality of battery cells. The electronic device may be a mobile terminal, an electric vehicle, an energy storage system, and the like. The mobile terminal may include a notebook computer, a tablet computer, a camera, a robot vacuum cleaner, a smart sound box, a radio, a portable projector, and the like. The electric vehicle may include an electric automobile, a balance bike, an electric wheelchair, a golf ball vehicle, an electric bicycle, an electric motorcycle, an electric forklift, an unmanned aerial vehicle, a robot, and the like. The energy storage system may include: an energy storage system in a photovoltaic power station, or may be an energy storage system in household solar energy, or the like. This is not limited in embodiments.

Further, the battery assisting apparatus may be applied to a battery management system (BMS) in the foregoing electronic device, or controlled by a BMS, to intelligently manage and maintain each battery cell in the electronic device in real time.

Further, the battery cell may be any one of a lead-acid battery, a nickel-cadmium battery, a nickel-iron battery, a nickel-hydrogen battery, a lithium-ion battery, and the like. This is not limited in the embodiments.

According to a first aspect, an embodiment may provide a battery assisting apparatus, including a piezoelectric transformer group and a drive circuit group. The piezoelectric transformer group includes N piezoelectric transformers, and the drive circuit group includes N drive circuits. Respective output ends of the N drive circuits are connected to respective input ends of the N piezoelectric transformers in a one-to-one correspondence, and respective output ends of the N piezoelectric transformers are connected to N battery cells in a battery string, where N is an integer greater than 1. M drive circuits in the N drive circuits are configured to respectively output first pulse signals to M piezoelectric transformers in the N piezoelectric transformers, where M is a positive integer less than N. Each of the M piezoelectric transformers is configured to receive the first pulse signal, and output, driven by the first pulse signal, electric energy to the battery cell corresponding to each piezoelectric transformer for charging, so that voltages of the N battery cells are consistent.

A conventional battery balancing technology includes passive battery balancing and active battery balancing. In the passive battery balancing, battery balancing can be achieved by using only several load resistors to consume charges, which has a low cost, but easily causes a waste of a battery capacity. In the active battery balancing, a battery capacity is not required to be wasted, but additional components such as a magnetic-core transformer, an inductor, or a capacitor are required, which has a complex circuit structure and a high cost. In the embodiments, a plurality of piezoelectric transformers may be connected to a plurality of battery cells in a battery string in a one-to-one correspondence, and then a drive circuit controls one or more piezoelectric transformers to transmit electric energy to the one or more battery cells connected to the piezoelectric transformers for charging, so that voltages of the plurality of battery cells in the battery string are consistent, to replace a conventional magnetic-core transformer with the piezoelectric transformers to complete the active battery balancing. In this way, compared with a solution in which a magnetic-core transformer is used in most existing battery balancing technologies, and battery balancing occupies a large circuit area and is heavy due to a large volume and a large weight of a magnet, the embodiments can use the piezoelectric transformers with small sizes, light weights and high conversion efficiencies to implement efficient and lightweight battery balancing, to effectively keep the voltages of all the battery cells consistent to prolong a service life of a battery. A circuit area occupied by the battery balancing, a weight and the like can be further reduced to an extremely large extent, and an overall volume and weight of an electronic device can be then reduced. This greatly meets actual market requirements for lightweight and integrated electronic devices of various types and brings convenience to users.

In some possible implementations, the N drive circuits are further configured to respectively output second pulse signals to the N piezoelectric transformers, where a frequency of the second pulse signal is greater than a frequency of the first pulse signal; each of the N piezoelectric transformers is configured to: receive the second pulse signal, and generate an ultrasonic wave driven by the second pulse signal; and the ultrasonic wave is used to detect a state of health of the battery cell corresponding to each piezoelectric transformer.

In the embodiments, high-frequency pulse signals (for example, the second pulse signals) may be output to the piezoelectric transformers by using the drive circuits, to control the piezoelectric transformers to generate the ultrasonic waves. The ultrasonic waves generated by the piezoelectric transformers can be configured to detect the state of health of the battery cells. In this way, compared with an existing technology for detecting health of a battery by using ultrasonic waves, in which, an additional ultrasonic generator with a large volume and a large weight needs to be equipped, resulting in high battery health detection costs and a large quantity of devices, the embodiments can generate the ultrasonic waves only by using the piezoelectric transformers with the small volumes and the light weights, to implement simple, convenient, and low-cost battery health detection.

In addition, as described above, in this embodiment, when the battery balancing is implemented by using the piezoelectric transformers, the battery health detection may be further implemented by using the piezoelectric transformers. That is, the same piezoelectric transformers in a circuit meet requirements of both the battery balancing and the battery health detection, which greatly increases a reuse rate of a component, reduces overall costs of the battery balancing and the battery health detection, and reduces a circuit area overall occupied by the battery balancing and the battery health detection, to further meet market requirements for lightweight and integrated devices.

In some possible implementations, the apparatus further includes a voltage detection circuit and a digital processing circuit; an output end of the digital processing circuit is connected to respective input ends of the N drive circuits; the voltage detection circuit is separately connected to the N battery cells and the digital processing circuit; the voltage detection circuit is configured to: detect respective voltage values of the N battery cells, and send the respective voltage values of the N battery cells to the digital processing circuit; the digital processing circuit is configured to: determine M battery cells from the N battery cells according to the respective voltage values of the N battery cells; respective voltage values of the M battery cells are less than a minimum voltage value among voltage values of N-M battery cells; the N-M battery cells belong to the N battery cells; and the M piezoelectric transformers are connected to the M battery cells in a one-to-one correspondence. Optionally, the M battery cells may be one or more battery cells with the voltage values less than an average voltage value of the N battery cells, or may be a battery cell (namely, M=1) with the minimum voltage value among the N battery cells, or may be all the rest battery cells except the battery cell with the maximum voltage value among the N battery cells (that is, M=N−1), or may be one or more battery cells with low voltage values in a preset ratio (for example, 20%, 50%, or the like) among the N battery cells, or the like. This is not limited in the embodiments. For details, refer to descriptions in the following embodiments. Details are not described herein again.

In some possible implementations, the digital processing circuit may be configured to: obtain an average voltage value of the N battery cells through calculation according to the respective voltage values of the N battery cells and determine the M battery cells from the N battery cells. The respective voltage values of the M battery cells are less than the average voltage value of the N battery cells.

In the embodiments, the current respective voltage values of the plurality of battery cells may be detected by using the voltage detection circuit (for example, including an analog to digital converter) connected to the plurality of battery cells, and the respective voltage values of the plurality of battery cells are respectively output to the digital processing circuit (for example, including a microprocessor). Then, the digital processing circuit may calculate the current average voltage value of the plurality of battery cells according to the respective voltage values of the plurality of battery cells, and determine one or more battery cells (for example, the M battery cells) with the voltages less than the average value. Then, the digital processing circuit may control the corresponding drive circuits to output pulse signals to the corresponding piezoelectric transformers, to charge the one or more battery cells with the low voltages (that is, a small quantity of currently available electricity). In this way, reliable and efficient battery balancing is implemented by using the piezoelectric transformers. Compared with a conventional magnetic-core transformer, the embodiments can use the piezoelectric transformers with small sizes, light weights and high conversion efficiencies to implement efficient and lightweight battery balancing, to effectively keep the voltages of all the battery cells consistent to prolong a service life of a battery. A circuit area occupied by the battery balancing, a weight and the like can be further reduced to an extremely large extent, and an overall volume and weight of an electronic device can be then reduced.

In some possible implementations, each of the N piezoelectric transformers includes a first piezoelectric layer and a second piezoelectric layer; the first piezoelectric layer and the second piezoelectric layer are coupled by using an insulation layer; the first piezoelectric layer is connected to the input end of the piezoelectric transformer, and the second piezoelectric layer is connected to the output end of the piezoelectric transformer; thicknesses of the first piezoelectric layer and the second piezoelectric layer are within a preset thickness range; a minimum value in the preset thickness range satisfies lowest conversion efficiency of the piezoelectric transformer, and a maximum value in the preset thickness range satisfies an ultrasonic wave generation condition; and the lowest conversion efficiency satisfies that the voltages of the N battery cells are consistent driven by the first pulse signals.

In the embodiments, the piezoelectric transformer may include the first piezoelectric layer and the second piezoelectric layer that are respectively connected to the input end and the output end. In the embodiments, the thicknesses of the first piezoelectric layer and the second piezoelectric layer in the piezoelectric transformer are optimized, so that the first piezoelectric layer and the second piezoelectric layer can satisfy the lowest conversion efficiency of the piezoelectric transformer, that is, a plenty of electric energy can be output to the corresponding battery cell through electric energy-mechanical energy-electric energy conversion between the first piezoelectric layer and the second piezoelectric layer, to ensure the reliable and efficient battery balancing. The ultrasonic wave generation condition can also be satisfied, that is, after the high-frequency pulse signal is received, the first piezoelectric layer and the second piezoelectric layer can generate corresponding high-frequency vibrations (a frequency of which is at least equal to the lowest frequency (which may be 20 KHz) of the ultrasonic wave), to transmit the ultrasonic wave. In this way, in the embodiments, a structure of the piezoelectric transformer is optimized, so that the piezoelectric transformer in the embodiments can satisfy working conditions of battery balancing and battery health detection, to greatly increase a reuse rate of a component (including, but not limited to, the piezoelectric transformer, and for example, a switch) in a circuit, reduce a circuit area, significantly reduce overall production and manufacturing costs, and the like.

It should be noted that a thinner piezoelectric layer indicates a higher vibration frequency and a larger probability of generating ultrasonic waves. However, a higher vibration frequency means more mechanical energy generated and a greater loss of electric energy. As a result, the conversion efficiency of the piezoelectric transformer will be reduced, that is, electric energy of the output end is far less than that of the input end. Therefore, it is emphasized again that in the embodiments, the structure of the piezoelectric transformer is analyzed and optimized in essence, to provide an effective assurance for subsequent reliable implementation of battery balancing and battery health detection.

In some possible implementations, the N piezoelectric transformers may be configured to: generate the ultrasonic waves through high-frequency vibrations generated by the first piezoelectric layer and the second piezoelectric layer of each of the N piezoelectric transformers driven by the second pulse signal and transmit the ultrasonic waves to the battery cell corresponding to each piezoelectric transformer.

In the embodiments, as described above, the thicknesses of the piezoelectric layers in the piezoelectric transformers can be controlled within a range based on the ultrasonic wave generation condition, so that the piezoelectric layers in the piezoelectric transformers can generate the corresponding high-frequency vibrations by using the input high-frequency pulse signals, to generate the ultrasonic waves and transmitting the ultrasonic waves to the corresponding battery cells. In this way, in the embodiments, the piezoelectric transformers can be used to replace a conventional ultrasonic generator (or an ultrasonic sensor) with a large volume and a high cost, to implement more efficient and convenient battery health detection, to perform real-time intelligent detection and maintain for battery health and ensure a use experience of a user.

In some possible implementations, the respective input ends of the N drive circuits are connected to the battery string, and voltages of the first pulse signals and voltages of the second pulse signals are voltages of the N battery cells connected in series.

It should be understood that since the various battery cells in the battery string are power supplies, the plurality of battery cells can be connected in series to form a high-voltage power supply. Therefore, in the embodiments, the various drive circuits may be connected to the battery string, and output, driven by the high-voltage power supply provided by the plurality of battery cells connected in series, pulse signals (for example, the first pulse signals and the second pulse signals) respectively required for the battery balancing and the battery health detection. Voltages of the pulse signals are a voltage obtained by connecting the plurality of battery cells in series. In this way, in the embodiments, neither the battery balancing nor the battery health detection needs to be implemented by using an external power supply, to achieve objectives of energy-saving, lightweight and efficient battery balancing and battery health detection.

In some possible implementations, the apparatus further includes a receiver circuit; the receiver circuit is separately connected to the piezoelectric transformer group and the digital processing circuit; the receiver circuit is configured to: receive a first electrical signal generated when each piezoelectric transformer transmits the ultrasonic wave and a second electrical signal generated when each piezoelectric transformer receives an echo reflected by the corresponding battery cell; and transmit the first electrical signal and the second electrical signal to the digital processing circuit; and the digital processing circuit is further configured to: determine the state of health of each battery cell based on an echo delay of each battery cell, where the echo delay is a time interval between a time point at which the receiver circuit receives the first electrical signal and a time point at which the receiver circuit receives the second electrical signal.

In the embodiments, during the battery health detection, an electrical signal (for example, the first electrical signal) generated when the piezoelectric transformer transmits the ultrasonic wave and an electrical signal (for example, the second electrical signal) generated when the piezoelectric transformer receives the echo reflected by the battery cell can be received in sequence by using the receiver circuit connected to the plurality of battery cells. Then, the echo delay of the battery cell is determined based on the time interval between the two consecutive electrical signals, and the state of health of the battery cell is determined according to the echo delay. It can be understood that in a gradual aging process of a battery cell, the battery cell will be continuously expanded and thickened. Therefore, a shorter echo delay indicates that the battery cell is newer and has a better state of health. Correspondingly, a longer echo delay indicates that the battery cell is older and has a poorer state of health. In this way, in the embodiments, the piezoelectric transformer may generate the ultrasonic wave, to implement simple, accurate, and fast battery health detection, to maintain the health of each battery cell in real time, to ensure a use experience of a user. For example, in the field of electric vehicles, driving safety of a user can be further ensured, and a traffic accident can be avoided.

In some possible implementation manners, the receiver circuit includes an amplifier group and an analog to digital converter; the amplifier group includes N amplifiers; respective input ends of the N amplifiers are connected to the respective output ends of the N piezoelectric transformers in a one-to-one correspondence; respective output ends of the N amplifiers are connected to an input end of the analog to digital converter; an output end of the analog to digital converter is connected to the digital processing circuit; each of the N amplifiers is configured to: receive the first electrical signal and the second electrical signal that are generated in sequence by the piezoelectric transformer corresponding to each amplifier, amplify the first electrical signal and the second electrical signal, and output the amplified first electrical signal and the amplified second electrical signal to the analog to digital converter in sequence; the analog to digital converter is configured to: convert the amplified first electrical signal and the amplified second electrical signal into a corresponding first digital signal and a corresponding second digital signal, and output the first digital signal and the second digital signal to the digital processing circuit in sequence; and the digital processing circuit may be configured to determine, based on the first digital signal and the second digital signal that are received in sequence, the echo delay of the battery cell corresponding to each amplifier.

In the embodiments, the receiver circuit may include the plurality of amplifiers connected to the respective output ends of the plurality of piezoelectric transformers in the one-to-one correspondence. The amplifiers can amplify the first electrical signal and the second electrical signal that are generated by the piezoelectric transformer, to ensure accuracy of the battery health detection, and avoid impact, such as missing detection and false detection, on the battery health detection caused by excessively weak electrical signals. In this way, in the embodiments, on the premise that the piezoelectric transformer is configured to generate the ultrasonic wave, to reduce a circuit area and a cost, accuracy and efficiency of the battery health detection can be further ensured, and an actual requirement can be met.

According to a second aspect, an embodiment may provide a battery assisting method, applied to an electronic device. The electronic device includes a battery string, a piezoelectric transformer group, and a drive circuit group. The piezoelectric transformer group includes N piezoelectric transformers, and the drive circuit group includes N drive circuits. Respective output ends of the N drive circuits are connected to respective input ends of the N piezoelectric transformers in a one-to-one correspondence, and respective output ends of the N piezoelectric transformers are connected to N battery cells in a battery string, where N is an integer greater than 1. The method includes: respectively outputting first pulse signals to M piezoelectric transformers in the N piezoelectric transformers by using M drive circuits in the N drive circuits, where M is a positive integer less than N; and receiving the first pulse signal by using each of the M piezoelectric transformers, and outputting, driven by the first pulse signal, electric energy to the battery cell corresponding to each piezoelectric transformer for charging, so that voltages of the N battery cells are consistent.

In some possible implementations, the method further includes: detecting respective voltage values of the N battery cells, and determining the M battery cells from the N battery cells according to the respective voltage values of the N battery cells, where the respective voltage values of the M battery cells are less than a minimum voltage value among voltage values of N-M battery cells; and the N-M battery cells belong to the N battery cells. Optionally, an average voltage value of the N battery cells may be obtained through calculation according to the respective voltage values of the N battery cells, to determine the M battery cells from the N battery cells. The respective voltage values of the M battery cells are less than the average voltage value of the N battery cells.

In some possible implementations, the method further includes: respectively outputting second pulse signals to the N piezoelectric transformers by using the N drive circuits, where a frequency of the second pulse signal is greater than a frequency of the first pulse signal; receiving the second pulse signal by using each of the N piezoelectric transformers, and generating an ultrasonic wave driven by the second pulse signal; and detecting a state of health of the battery cell corresponding to each piezoelectric transformer by using the ultrasonic wave.

In some possible implementations, the method further includes: receiving a first electrical signal generated when each piezoelectric transformer transmits the ultrasonic wave and a second electrical signal generated when each piezoelectric transformer receives an echo reflected by the corresponding battery cell; and determining, based on a time interval between time of receiving the first electrical signal and time of receiving the second electrical signal, an echo delay of the battery cell corresponding to each piezoelectric transformer, and determining the state of health of each battery cell based on the echo delay of each battery cell.

According to a third aspect, an embodiment may provide a battery pack, including a battery string and the battery assisting apparatus according to any item of the foregoing first aspect. The battery string includes N battery cells, where N is an integer greater than 1. Optionally, the battery pack may further include a processor, and the processor is configured to support the battery pack in performing corresponding functions in any battery assisting method provided in the second aspect. Optionally, the battery string and the battery assisting apparatus may be packaged into an independent battery pack, and may be mounted in or removed from any possible electronic device.

According to a fourth aspect, an embodiment may provide an automobile. The automobile includes a charging interface, a battery assembly, and a powertrain, where the battery assembly includes the battery pack according to the third aspect, and the powertrain includes a motor, a transmission, and the like. Optionally, the battery string in the battery pack may be a power battery of the automobile, and is connected to the powertrain, or the battery string may be a low-voltage storage battery in the automobile, and is connected to an electric device (for example, a speaker, a radio, or a floodlight) in the automobile to supply power to the automobile. The battery assisting apparatus in the battery pack may be applied to a BMS in the automobile, or controlled by the BMS. Optionally, the automobile may further include a high-voltage electric control assembly, and the high-voltage electric control assembly may include a vehicle-mounted direct current-direct current converter, a vehicle-mounted charger, and the like. Optionally, the automobile may be an electric automobile, a balance bike, an electric wheelchair, a golf cart, an electric bicycle, an electric motorcycle, an electric forklift, an unmanned aerial vehicle, a robot, or the like. Optionally, the electric automobile may be a pure electric automobile, or may be a hybrid automobile. Further, the powertrain of the hybrid automobile may further include an internal combustion engine.

According to a fifth aspect, an embodiment may provide an energy storage system. The energy storage system includes a charge and discharge control module, an electric energy conversion module, and the battery pack according to the third aspect. The electric energy conversion module may include an alternating current-direct current conversion module, a direct current-direct current conversion module, and the like. Optionally, the energy storage system may be connected to an alternating current power grid. The energy storage system may be an energy storage system in a power station such as a photovoltaic or wind power station, or may be an energy storage system in household solar energy, or the like. In a related technology, applications of the energy storage system may include energy storage on a distribution network side and energy storage on a user side. For the energy storage on the user side, a lifespan of a battery of the energy storage system may be basically calculated by using a quantity of cycles. As the quantity of cycles increases, a state of the battery deteriorates, which brings many inconveniences to power utilization of a user. Based on this, in the embodiments, battery balancing and battery health detection can be performed on a plurality of battery cells in a battery string by using the battery assisting apparatus provided, to ensure stable running of the energy storage system and ensure power utilization quality and safety of a user.

According to a sixth aspect, an embodiment may provide an electronic device. The electronic device includes a processor, and the processor is configured to support the electronic device in performing corresponding functions in any battery assisting method provided in the second aspect. The electronic device may further include a memory. The memory is configured to be coupled to the processor, and the memory stores program instructions and data that are necessary for the electronic device. The electronic device may further include a communication interface, used for communication between the electronic device and another device or a communication network.

According to a seventh aspect, an embodiment may provide a computer readable storage medium. The computer readable storage medium stores a computer program. When the computer program is executed by a processor, the flow of any battery assisting method in the second aspect is implemented.

According to an eighth aspect, an embodiment may provide a computer program. The computer program includes instructions. When the computer program is executed by a computer, the computer is enabled to perform the flow of any battery assisting method in the second aspect.

According to a ninth aspect, an embodiment may provide a chip. The chip includes a processor and a communication interface. The processor is configured to invoke instructions from the communication interface and run the instructions. When the processor executes the instructions, the chip is enabled to perform the flow of any battery assisting method in the second aspect.

In conclusion, a battery balancing technology is a manner of effectively prolonging a service life of a battery and ensuring a state of health of the battery, and the battery health detection is a manner of ensuring use safety of a battery in real time. In an existing electronic device in which a plurality of battery cells may supply electric energy, battery balancing and battery health detection may need to be performed, to ensure a use experience and personal safety of a user. Based on this, in the embodiments, a conventional piezoelectric sensor is optimized, and the optimized piezoelectric sensor is used to replace a conventional magnetic-core transformer to perform the battery balancing. In addition, the optimized piezoelectric sensor is used to replace a conventional ultrasonic sensor to perform the battery health detection. On the one hand, based on advantages of a small volume, a lightweight, and a high conversion efficiency of the piezoelectric transformer, in the embodiments o, a circuit area occupied by the battery balancing and a weight can be greatly reduced, to implement lightweight and efficient battery balancing. On the other hand, likewise, based on the advantages of the small volume and the lightweight of the piezoelectric transformer, in the embodiments, a circuit area occupied by the battery health detection and a weight can also be greatly reduced, to implement simple, convenient, and efficient battery health detection. Further, as described above, in the embodiments, the same piezoelectric transformer can be used to implement both the battery balancing and the battery health detection. Therefore, in the embodiments, a reuse rate of a component (including, but not limited to, the piezoelectric transformer) in a circuit is further greatly increased, and a circuit area overall occupied by the battery balancing and the battery health detection can be reduced to an extremely large extent. Correspondingly, overall production and manufacturing costs of the electronic device are significantly reduced, and a development trend of lightweight electronic devices and a user requirement are met.

Figure 7:
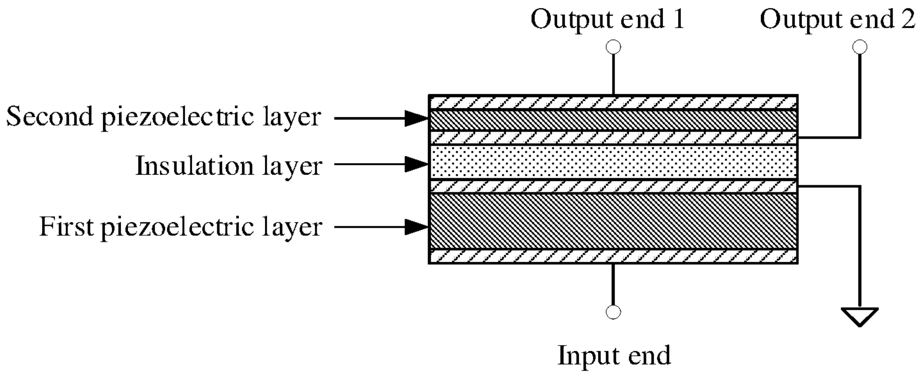
Figure 8:
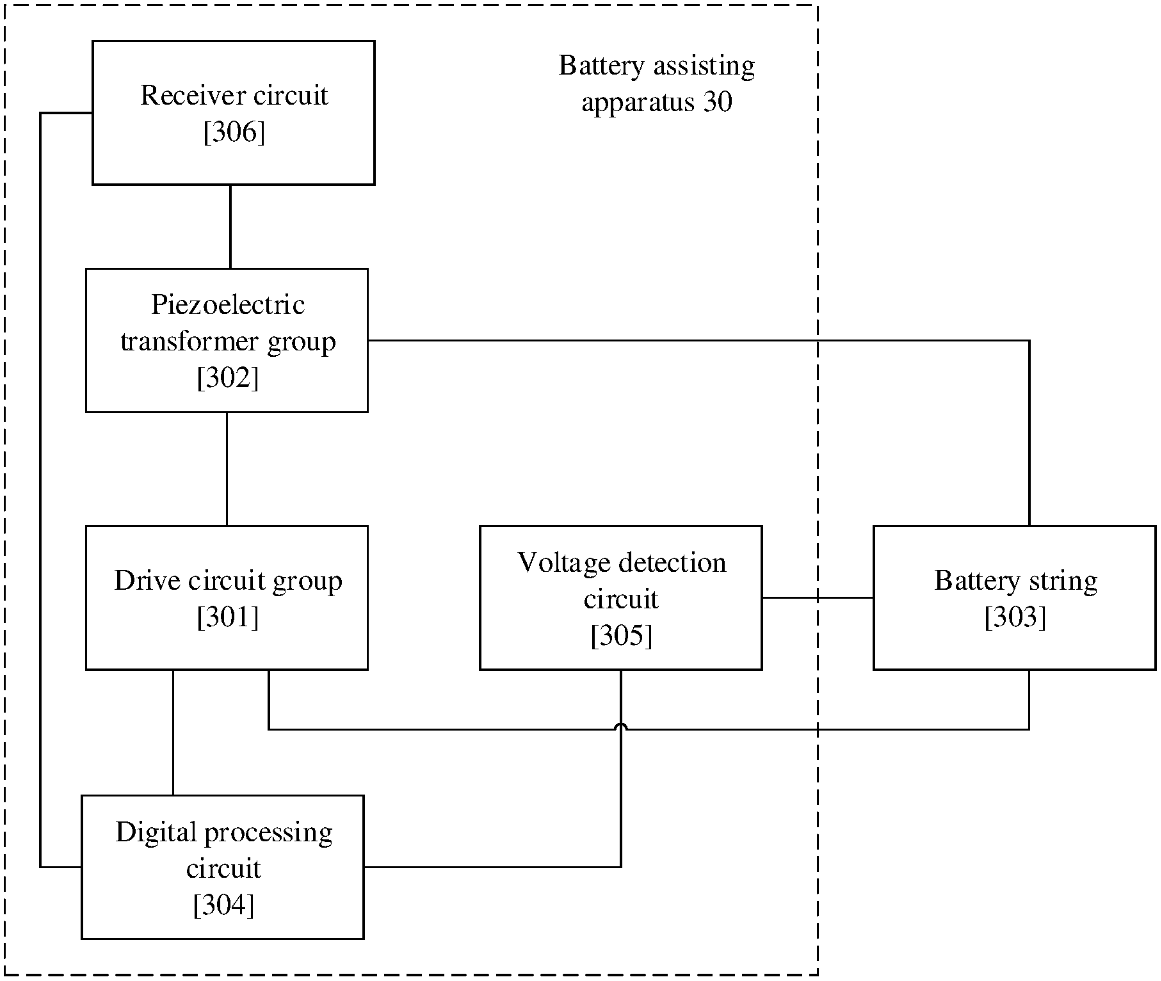
Figure 9:
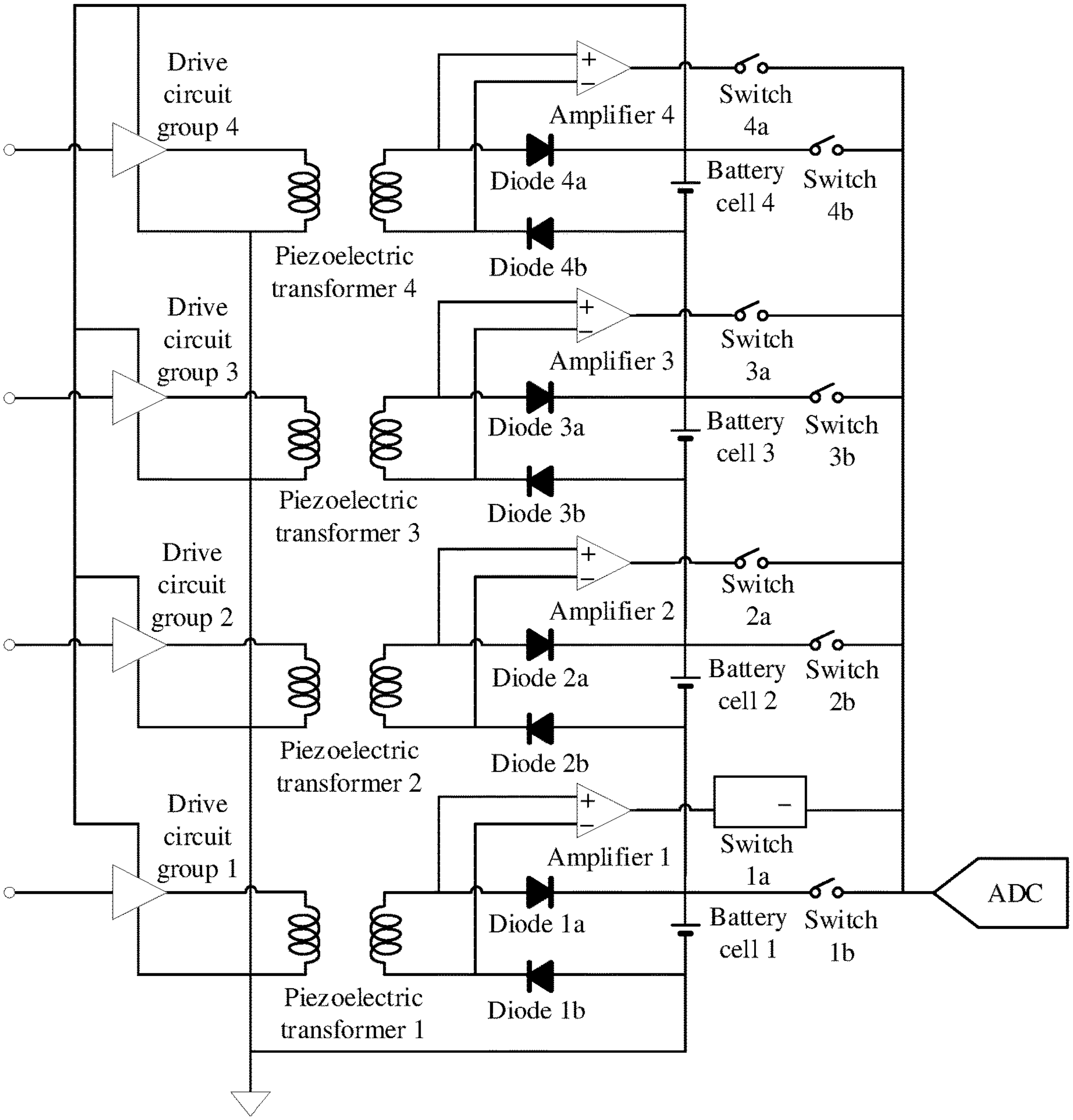
Figure 10:
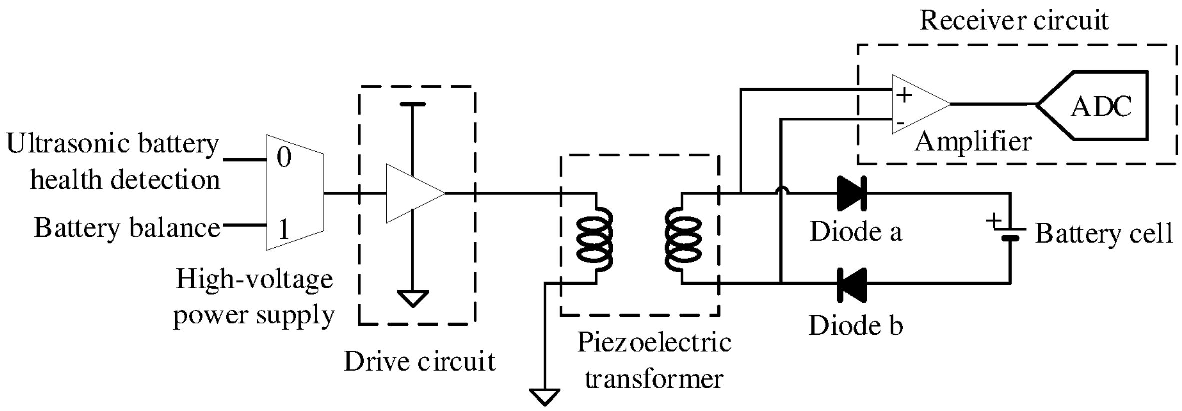
Figure 11:
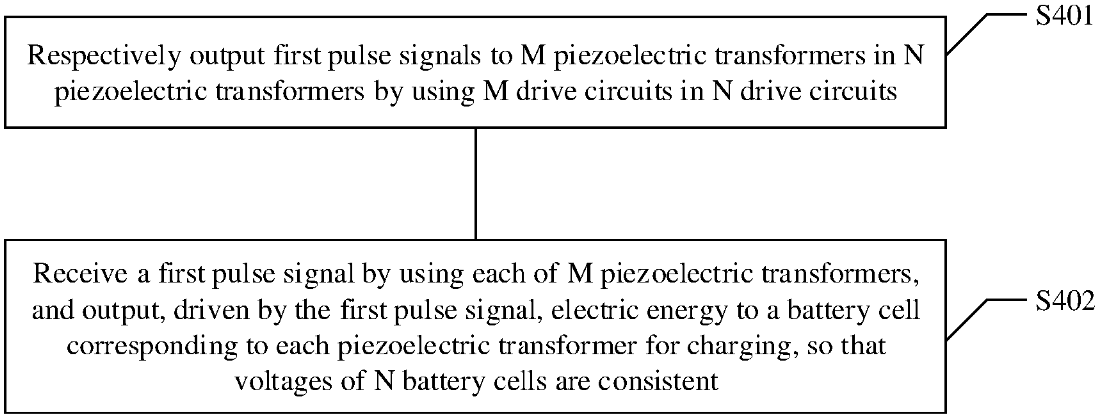

FIG. **6*a*** is a schematic diagram of working of a group of battery assisting apparatuses according to an embodiment;

FIG. **6*b*** is a schematic diagram of working of a group of battery assisting apparatuses according to an embodiment;

FIG. 7 is a schematic diagram of a structure of a piezoelectric transformer according to an embodiment;

FIG. 8 is a schematic diagram of a structure of another battery assisting apparatus according to an embodiment;

FIG. 9 is a schematic diagram of a circuit structure for battery balancing and battery health detection according to an embodiment;

FIG. 10 is a schematic diagram of another circuit structure for battery balancing and battery health detection according to an embodiment; and FIG. 11 is a schematic flowchart of a battery assisting method according to an embodiment.

DETAILED DESCRIPTION OF THE EMBODIMENTS

The following describes the embodiments with reference to the accompanying drawings.

In the embodiments and accompanying drawings, the terms "first", "second", and the like are intended to distinguish between different objects but do not indicate a particular order. In addition, terms "include", "have", and any other variant thereof are intended to cover non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device. It should be noted that when an element is referred to as being "coupled" or "connected" to another one or more elements, the element may be directly connected to the one or more elements or may be indirectly connected to the one or more elements.

It should be understood that "at least one (item)" refers to one or more and "a plurality of" refers to two or more. The term "and/or" is used for describing an association relationship between associated objects and represents that three relationships may exist. For example, "A and/or B" may represent the following three cases: only A exists, only B exists, and both A and B exist, where A and B may be singular or plural. The character "/" may indicate an "or" relationship between associated objects. "At least one of the following items (pieces)" or a similar expression thereof refers to any combination of these items, including any combination of singular items (pieces) or plural items (pieces). For example, at least one of a, b, or c may indicate a, b, c, a and b, a and c, b and c, or a, b, and c, where a, b, and c may be singular or plural.

Reference to "an embodiment" herein means that a particular feature, structure, or characteristic described in conjunction with an embodiment may be included in at least one embodiment. The phrase shown in various locations specification may not necessarily refer to a same embodiment and is not an independent or optional embodiment exclusive from another embodiment. It is explicitly and implicitly understood by persons skilled in the art that embodiments may be combined with another embodiment.

The terms such as "component", "module", and "system" are used to indicate a computer-related entity, hardware, firmware, a combination of hardware and software, software, or software being executed. For example, a component may be, but is not limited to, a process that is run on a processor, a processor, an object, an executable file, a thread of execution, a program, and/or a computer. As shown in figures, both a processor and an application that runs on the processor may be components. One or more components may reside within a process and/or an execution thread, and a component may be located on one computer and/or distributed between two or more computers. In addition, these components may be executed by various computer readable media that store various data structures. The components may communicate by using a local and/or remote process and based on, for example, a signal having one or more data packets (for example, data from two components interacting with another component in a local system, in a distributed system, and/or across a network such as the Internet interacting with other systems by using the signal).

Some terms are first explained and described, to help persons skilled in the art have a better understanding.

(1) Battery balancing refers to using a power electronics technology to keep a voltage deviation of a single lithium-ion battery or a voltage deviation of a battery string within an expected range, to ensure that each single battery (or referred to as a battery cell) maintains a same state during normal use, for example, maintains a same voltage, to avoid occurrence of battery overcharge or overdischarge. This prolongs a lifespan of a battery and improves performance of the battery. Battery balancing may include two manners: passive balancing and active balancing. In the embodiments, a piezoelectric transformer may be used to replace a conventional magnetic-core transformer to implement active balancing. For implementation, refer to descriptions in subsequent embodiments. Details are not described herein again.

(2) Battery health detection may be used for detecting an aging state and a state of health of a battery, including a state of charge (SOC) of the battery. A common battery health detection method includes using an electrochemical impedance spectroscopy (EIS) or ultrasonic waves. Using the ultrasonic waves to perform the battery health detection is simpler and more convenient. A physical change of a battery may be detected by transmitting the ultrasonic waves and receiving an echo reflected by the battery, to quickly and accurately obtain a change in a state of health of the battery. In the embodiments, the ultrasonic wave can be generated through high-frequency vibrations of a piezoelectric body in a piezoelectric transformer, to implement the battery health detection. For implementation, refer to descriptions in subsequent embodiments. Details are not described herein again.

(3) A piezoelectric transformer uses piezoelectric effect and inverse piezoelectric effect of a polarized piezoelectric body to transmit electric energy. Compared with a conventional electromagnetic transformer, the piezoelectric transformer has advantages of a small volume, light weight, anti-electromagnetic interference, high conversion efficiency, and the like. A working principle of the piezoelectric transformer is as follows: An input portion of the piezoelectric transformer is driven by a voltage signal. The input portion is enabled to vibrate through the inverse piezoelectric effect. Vibration waves are coupled to an output portion through mechanical structures of the input and output portions. The output portion generates charges through direct piezoelectric effect. In this way, secondary conversion of electric energy of the piezoelectric body to mechanical energy and then to electromechanical energy of electric energy is implemented. Further, when impedances of the input portion and the output portion are not equal, voltages and currents of the input portion and the output portion are not equal, to implement a function of converting the voltages and the currents between an input and an output, that is, to implement the "transformation". In embodiments, sizes (for example, thicknesses) of the piezoelectric bodies in the input and output portions of the piezoelectric transformer can be controlled, so that different vibration frequencies generated by the piezoelectric bodies under an action of drive signals with different frequencies can satisfy conversion efficiency required by the piezoelectric transformer and an ultrasonic wave generation condition (for example, a frequency is greater than 20 KHz). In this way, the battery balancing and the battery health detection are respectively implemented by using the same piezoelectric transformer. A reuse rate of a component is significantly improved, a circuit area is reduced, and costs are reduced.

First, to facilitate an understanding of the embodiments, a problem to be resolved is further analyzed and proposed. In the related technology, a battery balancing technology includes various solutions. The following exemplarily lists several common solutions.

Figure 1:
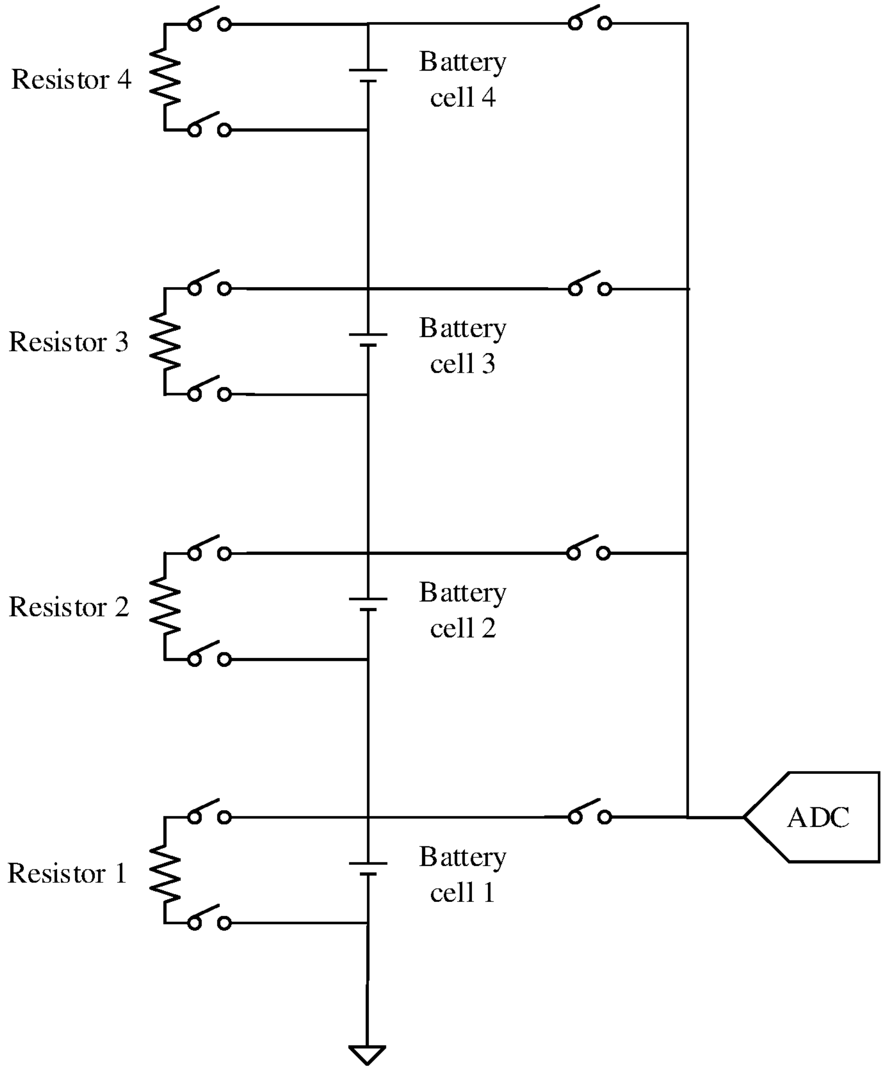
FIG. 1 is a schematic diagram of a circuit structure of passive battery balancing.

FIG. 1 is a schematic diagram of a circuit structure of passive battery balancing. As shown in FIG. 1, the circuit structure may include a battery string composed of a plurality of battery cells. The plurality of battery cells may include a battery cell 1, a battery cell 2, a battery cell 3, and a battery cell 4 shown in FIG. 1. As shown in FIG. 1, the circuit structure further includes a resistor 1, a resistor 2, a resistor 3, and a resistor 4 that are respectively connected to the battery cell 1, the battery cell 2, the battery cell 3, and the battery cell 4 in a one-to-one correspondence, and a plurality of corresponding switches. As shown in FIG. 1, the circuit structure further includes an analog to digital converter (ADC) respectively connected to the battery cell 1, the battery cell 2, the battery cell 3, and the battery cell 4.

Refer to FIG. 1 together. Conventional passive battery balancing includes: respectively measuring voltages of the battery cell 1, the battery cell 2, the battery cell 3, and the battery cell 4 by using the ADC. When the voltages of the battery cells are not equal, redundant voltages in the plurality of battery cells may be released by using the plurality of resistors correspondingly connected to the plurality of battery cells with high voltages, so that the voltages of all the battery cells are consistent with a minimum voltage. Therefore, these resistors are also referred to as bypass resistors or bleeder resistors. For example, if it is measured by using the ADC that the voltage of the battery cell 1 is 3 V, the voltage of the battery cell 2 is 3.2 V, the voltage of the battery cell is 3.5 V, and the voltage of the battery cell 4 is 3.3 V, redundant charges in the battery cell 2, the battery cell 3, and the battery cell 4 may be consumed by using the resistor 2, the resistor 3, and the resistor 4 that are respectively connected to the battery cell 2, the battery cell 3, and the battery cell 4 in the one-to-one correspondence. Therefore, the voltages of the battery cell 1, the battery cell 2, the battery cell 3, and the battery cell 4 are all 3 V. Apparently, as described above, the passive battery balancing will seriously waste a battery capacity and cannot meet an actual requirement of a user.

Figure 2:
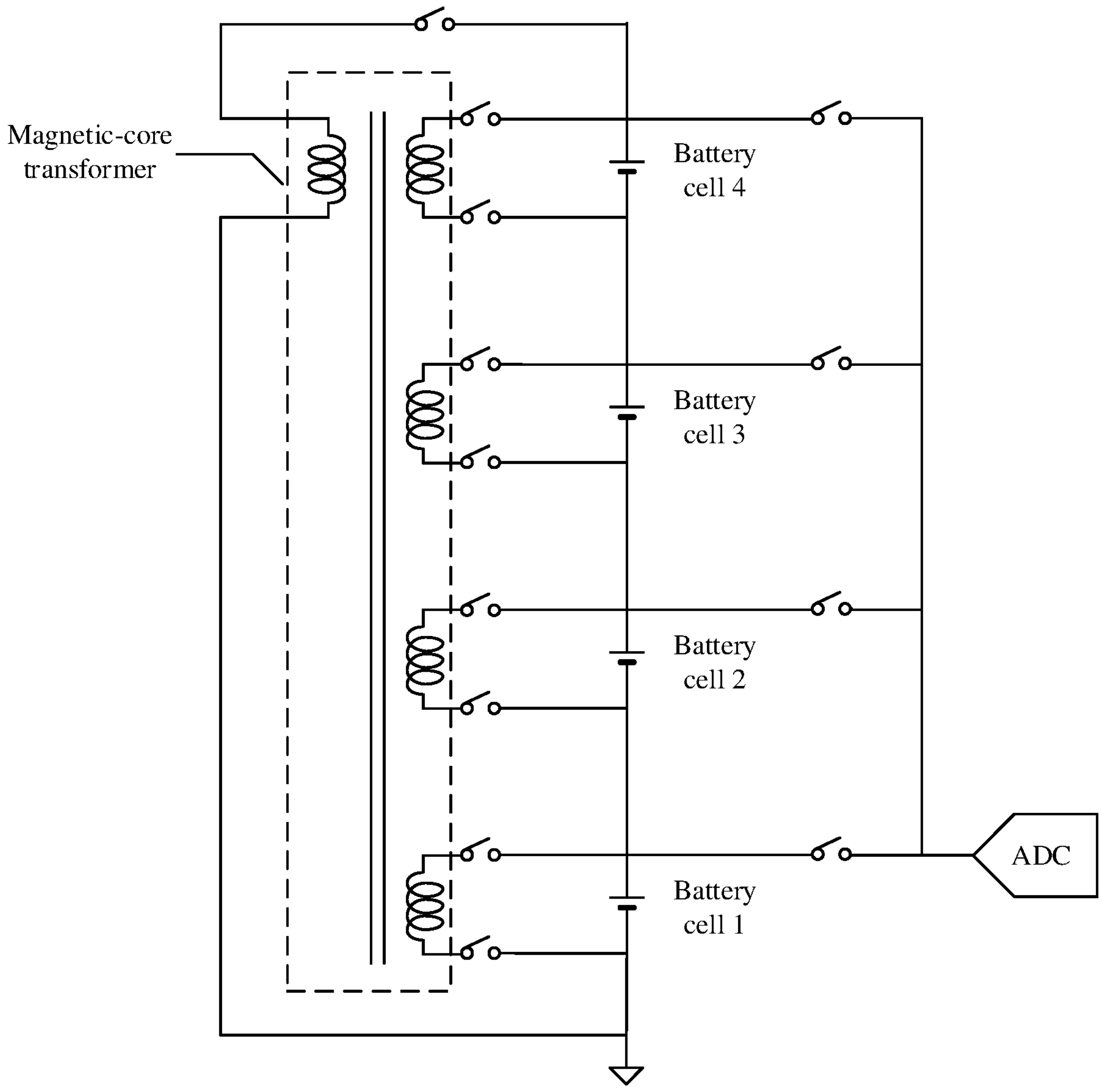
FIG. 2 is a schematic diagram of a circuit structure of active battery balancing.

Correspondingly, FIG. 2 is a schematic diagram of a circuit structure of active battery balancing. As shown in FIG. 2, the circuit structure may include a battery cell 1, a battery cell 2, a battery cell 3, and a battery cell 4, and an ADC respectively connected to the battery cell 1, the battery cell 2, the battery cell 3, and the battery cell 4. As shown in FIG. 2, the circuit structure further includes a magnetic-core transformer respectively connected to the battery cell 1, the battery cell 2, the battery cell 3, and the battery cell 4. As shown in FIG. 2, a primary winding on a left side of the magnetic-core transformer is connected to the battery cell 1, the battery cell 2, the battery cell 3, and the battery cell 4 that are connected in series, and four secondary windings on a right side of the magnetic-core transformer are respectively connected to the battery cell 1, the battery cell 2, the battery cell 3, and the battery cell 4 in a one-to-one correspondence.

Conventional active battery balancing includes: measuring voltages of the battery cell 1, the battery cell 2, the battery cell 3, and the battery cell 4 respectively by using the ADC. When the voltages of the various battery cells are not equal, first, a primary winding switch of the magnetic-core transformer may be turned on. At this time, the battery string charges the magnetic-core transformer. Then, the primary winding switch of the magnetic-core transformer is turned off, and a corresponding secondary winding switch (that is, the secondary winding switch corresponding to the battery cell with a low voltage) is turned on. At this time, the electric energy stored in the magnetic-core transformer can be transferred to the corresponding battery cell. In this way, the battery cell with the low voltage is charged by using the voltages of the plurality of battery cells connected in series, so that the voltages of the plurality of battery cells are consistent.

As described above, compared with the passive balancing, although the conventional active battery balancing does not consume the voltages of the battery cell and will not cause a waste of a battery capacity, costs of the conventional active battery balancing are high, and a circuit structure is complex. In addition, the magnetic-core transformer is large in volume and heavy, which easily causes a large circuit area occupied by the battery balancing and heaviness.

Therefore, to solve a problem that a current battery balancing technology does not meet an actual requirement, a problem to be actually resolved may include the following aspects: A piezoelectric transformer is used to replace a conventional magnetic-core transformer, so that a circuit area occupied by battery balancing and a weight are reduced based on the advantages of a small volume and light weight of the piezoelectric transformer, and efficient and lightweight battery balancing is implemented.

In addition, compared with a conventional electrochemical impedance spectroscopy (EIS) manner, an existing battery health detection technology is that although the existing ultrasonic waves can obtain a state of health of a battery cell more directly and conveniently by detecting a physical change of the battery cell, in the existing ultrasonic wave technology for detecting a battery health, an additional ultrasonic generator with a large volume and a large weight may need to be equipped, which easily causes a high battery health detection cost, a large quantity of devices that are heavy, and failure to meet actual requirement. Based on this, further, the piezoelectric transformer may be optimized. In this way, when the piezoelectric transformer is used to implement the foregoing battery balancing, the same piezoelectric transformer may also be used to generate an ultrasonic wave to implement battery health detection. This greatly improves a reuse rate of a component and reduces a circuit area and costs overall occupied by the battery balancing and the battery health detection.

Figure 3:
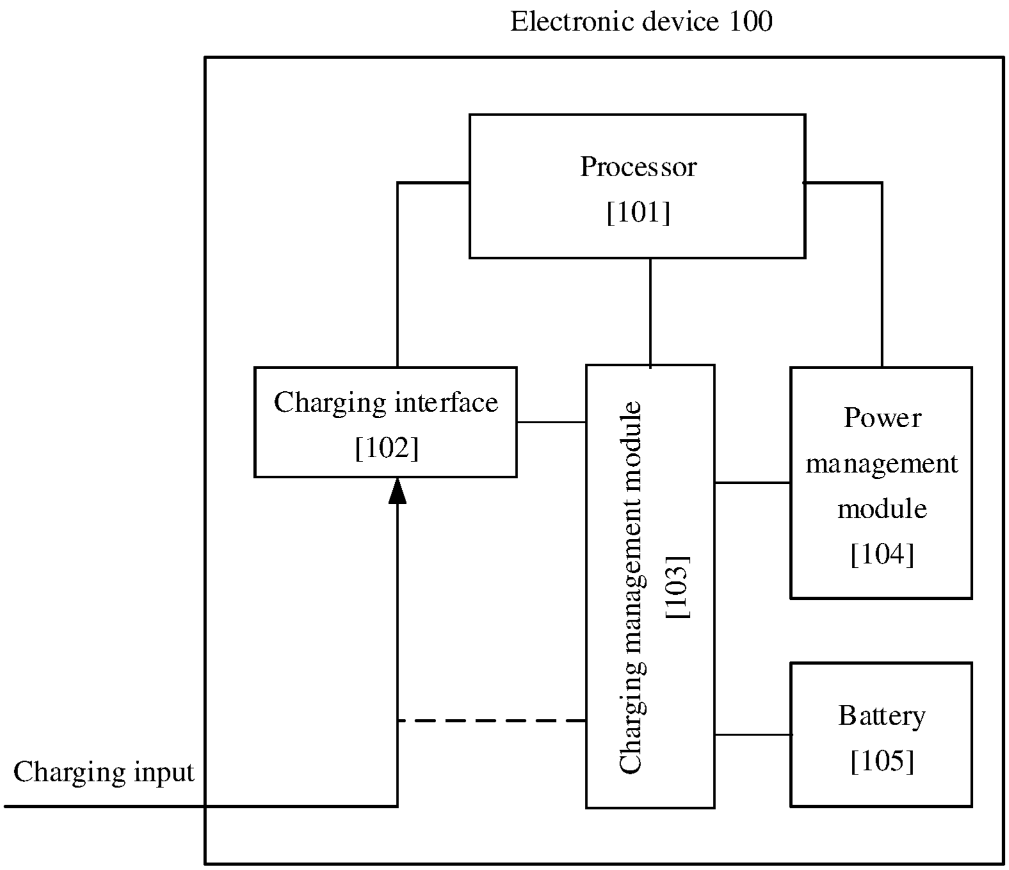
FIG. 3 is a schematic diagram of a structure of an electronic device according to an embodiment.

FIG. 3 is a schematic diagram of a structure of an electronic device according to an embodiment. The embodiments may be implemented in the structure shown in FIG. 3 or a similar structure.

As shown in FIG. 3, the electronic device 100 may include a processor 101, a charging interface 102, a charging management module 103, a power management module 104, and a battery 105. The battery 105 may include a plurality of battery cells.

The charging management module 103 is configured to receive a charging input from a charger. The charger may be a wireless charger or a wired charger. In some embodiments of wired charging, the charging management module 103 may receive a charging input from a wired charger through the charging interface 102. In some embodiments of wireless charging, the charging management module 103 may receive a wireless charging input through a wireless charging coil of the electronic device 100. Optionally, the charging management module 103 may further supply power to the electronic device by using the power management module 104 while charging the battery 105.

The power management module 104 is configured to be connected to the battery 105, the charging management module 103, and the processor 101. The power management module 104 receives an input of the battery 105 and/or the charging management module 103, and supplies power to various components (for example, the processor 101 in FIG. 3, or an internal memory, an external memory, a display screen, a camera, and a wireless communications module that are not shown in FIG. 3) in the electronic device 100. In some embodiments, the power management module 104 may be further configured to: monitor a battery capacity of the battery 105, detect a state of health of each battery cell in the battery 105, perform battery balancing, and the like, to intelligently manage and maintain each battery cell in the electronic device 100 in real time.

Optionally, in some embodiments, the plurality of battery cells in the battery 105 may be connected to a plurality of piezoelectric transformers in a one-to-one correspondence, to implement efficient and lightweight battery balancing and battery health detection by using the plurality of piezoelectric transformers. Optionally, the plurality of piezoelectric transformers may be located in the battery 105, or may be arranged in the power management module 104, or may even be independently arranged in other hardware circuits. In some possible embodiments, the power management module 104 may also be arranged in the processor 101. In some other embodiments, the power management module 104 and the charging management module 103 may be arranged in a same device. Optionally, the power management module 104, the charging management module 103, and the like may form a battery management system (BMS) in the electronic device 100.

It can be understood that the structure of the electronic device shown in FIG. 2 is merely an exemplary implementation in embodiments. The electronic device in embodiments includes, but is not limited to, the foregoing structures. In some possible embodiments, the electronic device may include more or fewer components than those shown in FIG. 3, for example, may further include a memory, a display screen, a camera, and the like. This is not limited in embodiments.

Optionally, the electronic device 100 may be a mobile terminal, an electric vehicle, an energy storage system, or the like that includes a plurality of battery cells: for example, a notebook computer, a tablet computer, a camera, a robot vacuum cleaner, a smart sound box, a radio, a portable projector, and the like. The electric vehicle may include an electric automobile, a balance bike, an electric wheelchair, a golf cart, an electric bicycle, an electric motorcycle, an electric forklift, an unmanned aerial vehicle, and a robot. An energy storage system in a photovoltaic power station may also be an energy storage system in household solar energy, or the like. This is not limited in embodiments.

Figure 4:
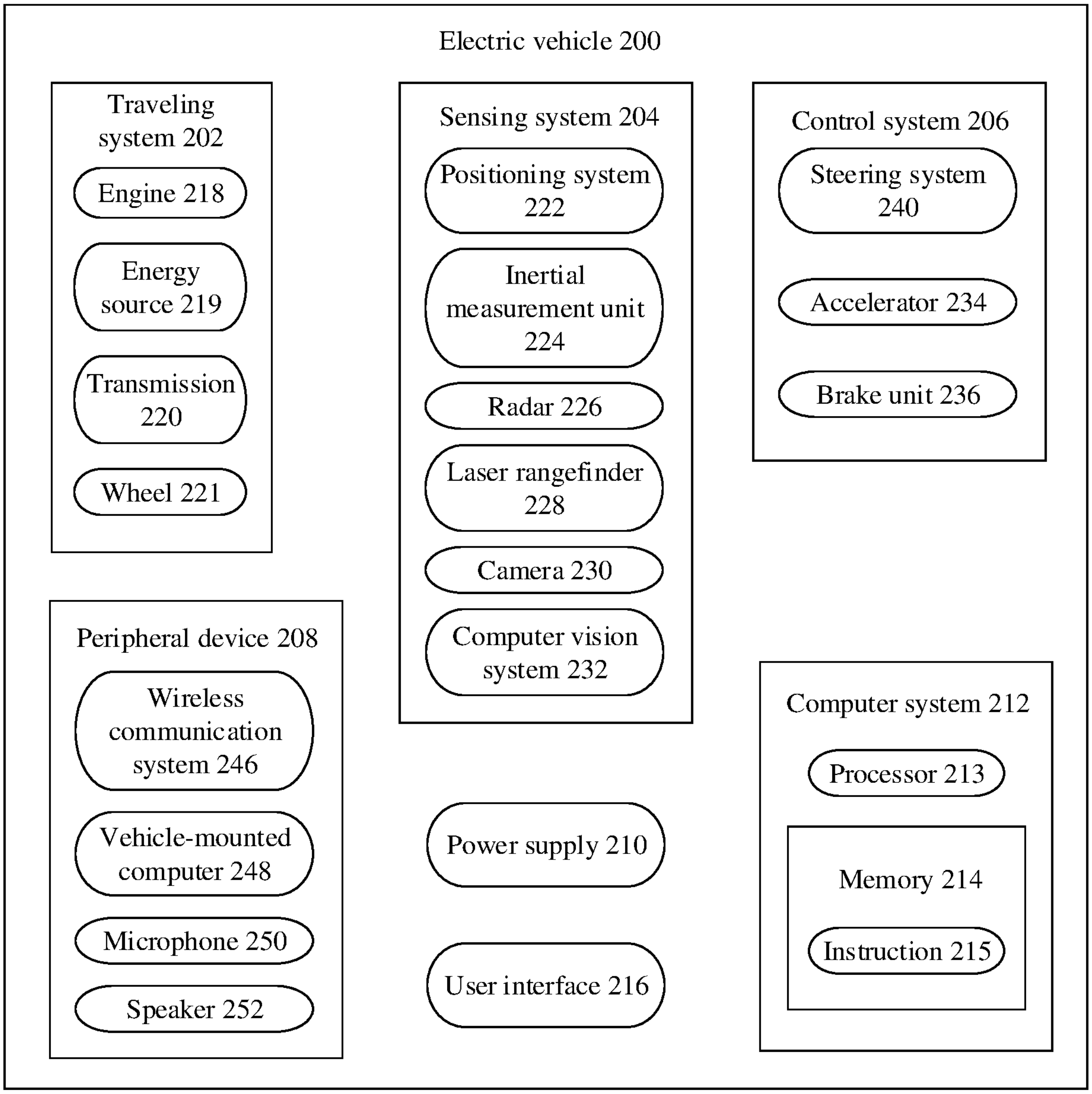
FIG. 4 is a schematic diagram of a structure of an electric vehicle according to an embodiment.

The following describes in detail an application scenario of the embodiments by using an example in which the electronic device 100 is an electric vehicle. FIG. 4 is a schematic diagram of a structure of an electric vehicle according to an embodiment. A battery assisting method provided in the embodiments may be applied to the electric vehicle 200 shown in FIG. 4. In some possible embodiments, the electric vehicle 200 may be configured to be in a fully or partially autopilot mode. When the electric vehicle 200 is in the autopilot mode, the electric vehicle 200 may be set to be operated without interacting with a user.

The electric vehicle 200 may include various subsystems, such as a traveling system 202, a sensing system 204, a control system 206, one or more peripheral devices 208, a power supply 210, a computer system 212, and a user interface 216. Optionally, the electric vehicle 200 may include more or fewer subsystems, and each subsystem may include a plurality of elements. In addition, each subsystem and the elements of the electric vehicle 200 may be interconnected in a wired or wireless manner.

The traveling system 202 may include components that provide power motion for the electric vehicle 200. In an embodiment, the traveling system 202 may include an engine 218, an energy source 219, a transmission 220, and wheels 221. The engine 218 may be an internal combustion engine, a motor, an air compression engine, or another type of engine combination, for example, a hybrid engine including a gasoline engine and a motor, or a hybrid engine including an internal combustion engine and an air compression engine. The engine 218 may convert the energy source 219 into mechanical energy.

Examples of the energy source 219 include gasoline, diesel, other petroleum-based fuels, propane, other compressed gas-based fuels, ethanol, and may also include a solar panel, a battery, and other electricity sources. The energy source 219 may also provide energy for other systems of the electric vehicle 200.

The transmission 220 may transmit mechanical power from the engine 218 to the wheel 221. The transmission 220 may include a gearbox, a differential, and a drive shaft. In an embodiment, the transmission 220 may further include another component, for example, a clutch. The drive shaft may include one or more shafts that may be coupled to one or more wheels 221.

The sensing system 204 may include several sensors. The several sensors may be configured to collect environment information about a surrounding of the electric vehicle 200 (for example, may include terrains, roads, motor vehicles, non-motor vehicles, pedestrians, roadblocks, traffic signs, traffic signal lights, animals, buildings, and plants around the electric vehicle 200). As shown in FIG. 4, the sensing system 204 may include a positioning system 222 (the positioning system may be a global positioning system (GPS), or may be a BeiBou system or other positioning systems), an inertial measurement unit (IMU) 224, a radar 226, a laser rangefinder 228, a camera 230, a computer vision system 232, and the like.

The positioning system 222 may be configured to estimate a geographical position of the electric vehicle 200. The IMU 224 is configured to sense changes in a position and an orientation of the electric vehicle 200 based on an inertial acceleration. In an embodiment, the IMU 224 may be a combination of an accelerometer and a gyroscope.

The radar 226 may use a radio signal to sense objects in a surrounding environment of the electric vehicle 200. In some possible embodiments, the radar 226 may be further configured to sense speeds and/or moving directions, and the like of vehicles around the electric vehicle 200. The radar 226 may be a laser radar, or may be a millimeter-wave radar, or the like.

The laser rangefinder 228 may sense, by using a laser, objects in an environment in which the electric vehicle 200 is located. In some possible embodiments, the laser rangefinder 228 may include one or more laser sources, one or more laser scanners, one or more detectors, and other system components.

The camera 230 may be configured to capture a plurality of images of the surrounding environment of the electric vehicle 200, for assisted driving or automatic driving. In some possible embodiments, the camera 230 may be a static camera or a video camera.

The computer vision system 232 may be operated to process and analyze the images captured by the camera 230 to recognize the objects and/or features in the surrounding environment of the electric vehicle 200. The objects and/or features may include terrains, motor vehicles, non-motor vehicles, pedestrians, buildings, traffic signals, road boundaries, obstacles, and the like. The computer vision system 232 may use an object recognition algorithm, a structure from motion (SFM) algorithm, video tracking, and other computer vision technologies.

The control system 206 controls operations of the electric vehicle 200 and components of the electric vehicle. The control system 206 may include various elements, including an accelerator 234, a brake unit 236, and a steering system 240.

The accelerator 234 is configured to control an operating speed of the engine 218 and control a speed of the electric vehicle 200.

The brake unit 236 is configured to control the electric vehicle 200 to be decelerated. The brake unit 236 may use friction to reduce a rotational speed of the wheel 221. In other embodiments, the brake unit 236 may convert kinetic energy of the wheel 221 into a current. The brake unit 236 may also use other forms to reduce the rotational speed of the wheel 221, to control the speed of the electric vehicle 200.

The steering system 240 may be operated to adjust a forward direction of the electric vehicle 200.

Further, in an embodiment, the control system 206 may add or alternatively include components other than those shown and described or may delete some of the foregoing components.

The electric vehicle 200 interacts with an external sensor, other vehicles, other computer systems, or a user by using the peripheral device 208. The peripheral device 208 may include a wireless communication system 246, a vehicle-mounted computer 248, a microphone 250, and/or a speaker 252.

In some embodiments, the peripheral device 208 provides a means for a user of the electric vehicle 200 to interact with the user interface 216. For example, a vehicle-mounted computer 248 may provide information to the user of the electric vehicle 200. The user interface 216 may further operate the vehicle-mounted computer 248 to receive a user input. The vehicle-mounted computer 248 may perform operations through a touchscreen. In other cases, the peripheral device 208 may provide a means for communication between the electric vehicle 200 and other devices located in the vehicle. For example, the microphone 250 may receive audios (for example, a voice command or other audio inputs) from the user of the electric vehicle 200. Similarly, the speaker 252 may output audios to the user of the electric vehicle 200.

The wireless communication system 246 may wirelessly communicate with one or more devices directly or through a communication network. For example, the wireless communication system 246 may use 3rd generation mobile networks (3G) cellular communications, for example, code division multiple access (CDMA), a global system for mobile communications (GSM)/general packet radio service (GPRS), or 4th generation mobile networks (4G) cellular communications, for example, long term evolution (LTE), or 5th generation mobile communication network (5G) cellular communications. The wireless communication system 246 may further communicate with a wireless local area network (WLAN) by using a wireless fidelity (Wi-Fi). In some embodiments, the wireless communication system 246 may directly communicate with a device by using an infrared link, Bluetooth, and the like. Other wireless protocols, for example, various vehicle communication systems, such as the wireless communication system 246, may include one or more dedicated short range communication (DSRC) devices, and these devices may include public and/or private data communication between the vehicle and/or roadside stations.

The power supply 210 may supply power to the various components of the electric vehicle 200. In an embodiment, the power supply 210 may be a rechargeable lithium-ion or lead-acid battery. One or more battery strings (each battery string may include a plurality of battery cells) of such a battery may be configured as a power supply to supply power to the various components of the electric vehicle 200. In some embodiments, the power supply 210 and the energy source 219 may be implemented together, for example, in some pure electric vehicles. In some embodiments, the power supply 210 may further internally include a plurality of piezoelectric transformers that are connected to the plurality of battery cells in a one-to-one correspondence. The plurality of piezoelectric transformers may be used to implement battery balancing and battery health detection on the plurality of battery cells in the electric vehicle 200, to intelligently ensure a driving experience and driving safety of a user.

Some or all functions of the electric vehicle 200 are controlled by the computer system 212. The computer system 212 may include at least one processor 213. The processor 213 executes instructions 215 stored in a non-transient computer readable medium such as the memory 214. The computer system 212 may also be a plurality of computing devices that control individual components or subsystems of the electric vehicle 200 in a distributed manner.

The processor 213 may be any conventional processor, such as a commercially available central processing unit (CPU). Optionally, the processor may be a dedicated device such as an application-specific integrated circuit (ASIC) or another hardware-based processor. Although FIG. 4 functionally illustrates a processor, a memory, and other elements of the computer system 212 in a same block, those of ordinary skill in the art should understand that the processor or the memory may actually include a plurality of processors or memories that are not stored in a same physical housing. For example, the memory may be a hard disk drive or another storage medium located in a housing different from the computer system 212. Therefore, a reference to a processor or a memory is understood to include a reference to a set of processors or memories that may or may not be operated in parallel. Unlike using a single processor to perform the steps described herein, for example, some components in the sensing system 204 may each have their own processor, and the processors perform only computations related to component-specific functions. For example, the power supply 210 may have its own processor, configured to control the corresponding piezoelectric transformers to perform battery balancing and battery health detection on the battery cells, and details are not described herein again.

In various aspects described herein, the processor 213 may be located far away from the vehicle and wirelessly communicate with the vehicle. In other aspects, some of the processes described herein are performed on the processor arranged in the vehicle, while others are performed by a remote processor.

In some embodiments, the memory 214 may include instructions 215 (for example, a program logic), and the instructions 215 may be executed by the processor 213 to perform the various functions of the electric vehicle 200, including the functions described above, for example, controlling the piezoelectric transformers to perform the corresponding battery balancing and battery health detection. The memory 214 may also include additional instructions, including instructions used for sending data to, receiving data from, interacting with, and/or controlling one or more of the traveling system 202, the sensing system 204, the control system 206, and the peripheral device 208.

In addition to the instructions 215, the memory 214 may further store data, for example, a large amount of sensor data collected by the sensing system 204 in a driving process, which may, for example, include image data captured by the camera 230 in the sensing system 204, point cloud data collected by the radar 226, and the like. In some embodiments, the memory 214 may further store, for example, voltage values and states of health (for example, degrees of aging) of the plurality of battery cells in the power supply 210, other information, and the like. Such information may be used by the wireless communication system 246, the computer system 212, or the like in the electric vehicle 200 during driving of the electric vehicle 200.

The user interface 216 is configured to provide information to or receive information from the user of the electric vehicle 200. Optionally, the user interface 216 may include one or more input/output devices within a set of peripheral devices 208, such as the wireless communication system 246, the vehicle-mounted computer 248, the microphone 250, and the speaker 252.

Optionally, one or more of the foregoing components may be separately mounted or associated with the electric vehicle 200. For example, the memory 214 may be partially or completely separated from the electric vehicle 200. The foregoing components may be communicatively coupled together in a wired and/or wireless manner.

In conclusion, the electric vehicle 200 may be an electric automobile, a balance bike, an electric wheelchair, a golf cart, an electric bicycle, an electric motorcycle, an electric forklift, an unmanned aerial vehicle, a robot, or the like, or may be a truck, a lawn mower, a playground device, a construction device, or the like. This is not limited in embodiments.

It can be understood that the structure of the electronic vehicle shown in FIG. 4 is merely an exemplary implementation in the embodiments. The electronic vehicle in the embodiments includes but is not limited to the foregoing structures.

Figure 5:
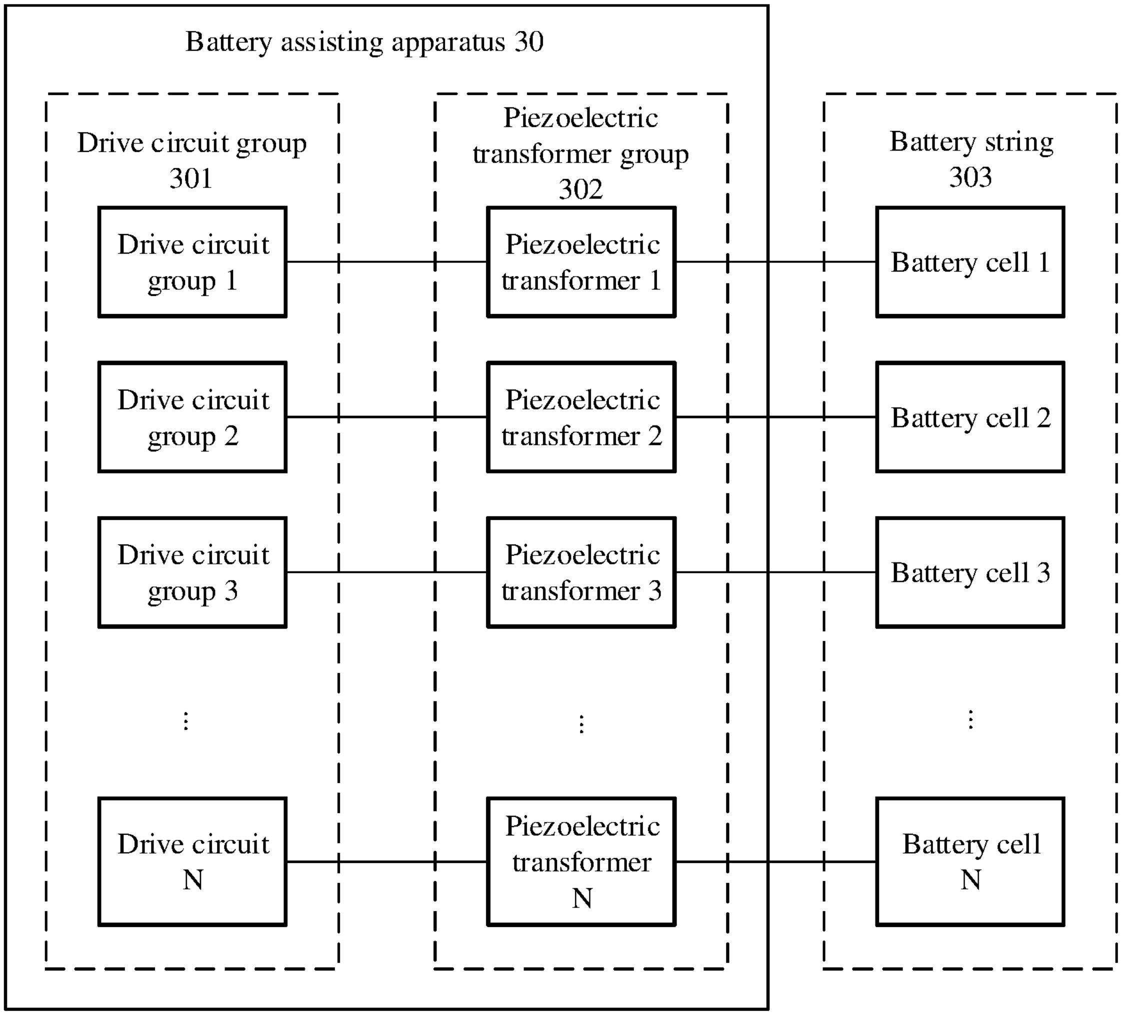
FIG. 5 is a schematic diagram of a structure of a battery assisting apparatus according to an embodiment.

FIG. 5 is a schematic diagram of a structure of a battery assisting apparatus according to an embodiment. As shown in FIG. 5, the battery assisting apparatus 30 may be applied to an electronic device, for example, the electronic device 100 shown in FIG. 3. The battery assisting apparatus 30 may be arranged in the battery 105 or the power management module 104.

As shown in FIG. 5, the battery assisting apparatus 30 may be connected to the battery string 303 in the electronic device. The battery string may include N battery cells, for example, including a battery cell 1, a battery cell 2, and a battery cell 3 shown in FIG. 5. As shown in FIG. 5, the battery assisting apparatus 30 includes a drive circuit group 301 and a piezoelectric transformer group 302. The drive circuit group 301 includes N drive circuits, for example, includes a drive circuit 1, a drive circuit 2, and a drive circuit 3 shown in FIG. 5. The piezoelectric transformer group 302 includes N piezoelectric transformers, for example, includes a piezoelectric transformer 1, a piezoelectric transformer 2, and a piezoelectric transformer 3 shown in FIG. 5. N is an integer greater than 1.

Further, as shown in FIG. 5, respective output ends of the N drive circuits are connected to respective input ends of the N piezoelectric transformers in a one-to-one correspondence, and respective output ends of the N piezoelectric transformers are connected to the N battery cells in the battery string 303 in a one-to-one correspondence.

M drive circuits in the N drive circuits may be configured to respectively output first pulse signals to M piezoelectric transformers in the N piezoelectric transformers, where M is a positive integer less than N. The M battery cells correspondingly connected to the M piezoelectric transformers are battery cells with low voltage values, for example, M battery cells with voltage values less than an average voltage value of the N battery cells.

Correspondingly, each of the M piezoelectric transformers may be configured to: receive the first pulse signal, and output, driven by the first pulse signal, electric energy to a battery cell corresponding to each piezoelectric transformer for charging, so that voltages of the N battery cells are consistent to implement active battery balancing.

As described above, in the embodiments, the piezoelectric transformer can be used to replace a conventional magnetic-core transformer to complete the active battery balancing. In this way, compared with a solution in which a magnetic-core transformer is used in most existing battery balancing technologies, and battery balancing occupies a large circuit area and is heavy due to a large volume and a large weight of a magnet, the embodiments can use the piezoelectric transformers with small sizes, light weights and high conversion efficiency to implement efficient and lightweight battery balancing, to effectively keep the voltages of all the battery cells consistent to prolong a service life of a battery. A circuit area occupied by the battery balancing, a weight and the like can be further reduced to an extremely large extent, and an overall volume and weight of an electronic device can be further reduced. This greatly meets actual market requirements for lightweight and integrated electronic devices of various types, and brings convenience to users.

Further, the N drive circuits may be further configured to output second pulse signals to the N piezoelectric transformers respectively, where a frequency of the second pulse signal is greater than a frequency of the first pulse signal. The frequency of the second pulse signal is at least greater than 20 KHz (that is, satisfying a lowest ultrasonic wave generation condition), and may be hundreds of KHz to several MHz.

Correspondingly, each of the N piezoelectric transformers may be further configured to: receive the second pulse signal, and generate an ultrasonic wave driven by the second pulse signal. The ultrasonic waves are transmitted to the corresponding N battery cells, and may be configured to detect a state of health of each battery cell. It can be understood that the frequency of the second pulse signal is equal to a frequency of the ultrasonic wave generated by the piezoelectric transformer.

It should be noted that as a battery ages, that is, as a state of health gets poorer, the battery will gradually expand, that is, a thickness of the battery will gradually increase. Based on this, the state of health of the battery cell may be directly and efficiently detected by using a time interval (or an echo delay) between a time point at which the piezoelectric transformer is used to transmit the ultrasonic wave and a time point at which the battery cell reflects an echo. A shorter echo delay indicates that the battery is thinner and the battery cell is newer and has a better state of health. Correspondingly, a longer echo delay indicates that the battery is thickener and the battery cell is older and has a poorer state of health.

As described above, compared with an existing technology for detecting health of a battery by using ultrasonic waves, in which an additional ultrasonic generator with a large volume and a large weight needs to be equipped, resulting in high battery health detection costs and a large quantity of devices, the embodiments can generate the ultrasonic waves only by using the piezoelectric transformers with the small volumes and the light weights, to implement simple, convenient, and low-cost battery health detection, to maintain the health of each battery cell in real time and ensure a use experience of a user. For example, in the field of electric vehicles, driving safety of a user can be further ensured, and a traffic accident can be avoided.

In conclusion, as described above, in the embodiments, when the battery balancing is implemented by using the piezoelectric transformers, the battery health detection may be further implemented by using the piezoelectric transformers. That is, the same piezoelectric transformers in a circuit meet requirements of both the battery balancing and the battery health detection, which greatly increases a reuse rate of a component, reduces overall costs of the battery balancing and the battery health detection, and reduces a circuit area overall occupied by the battery balancing and the battery health detection, to further meet market requirements for lightweight and integrated devices.

Figure 6A:
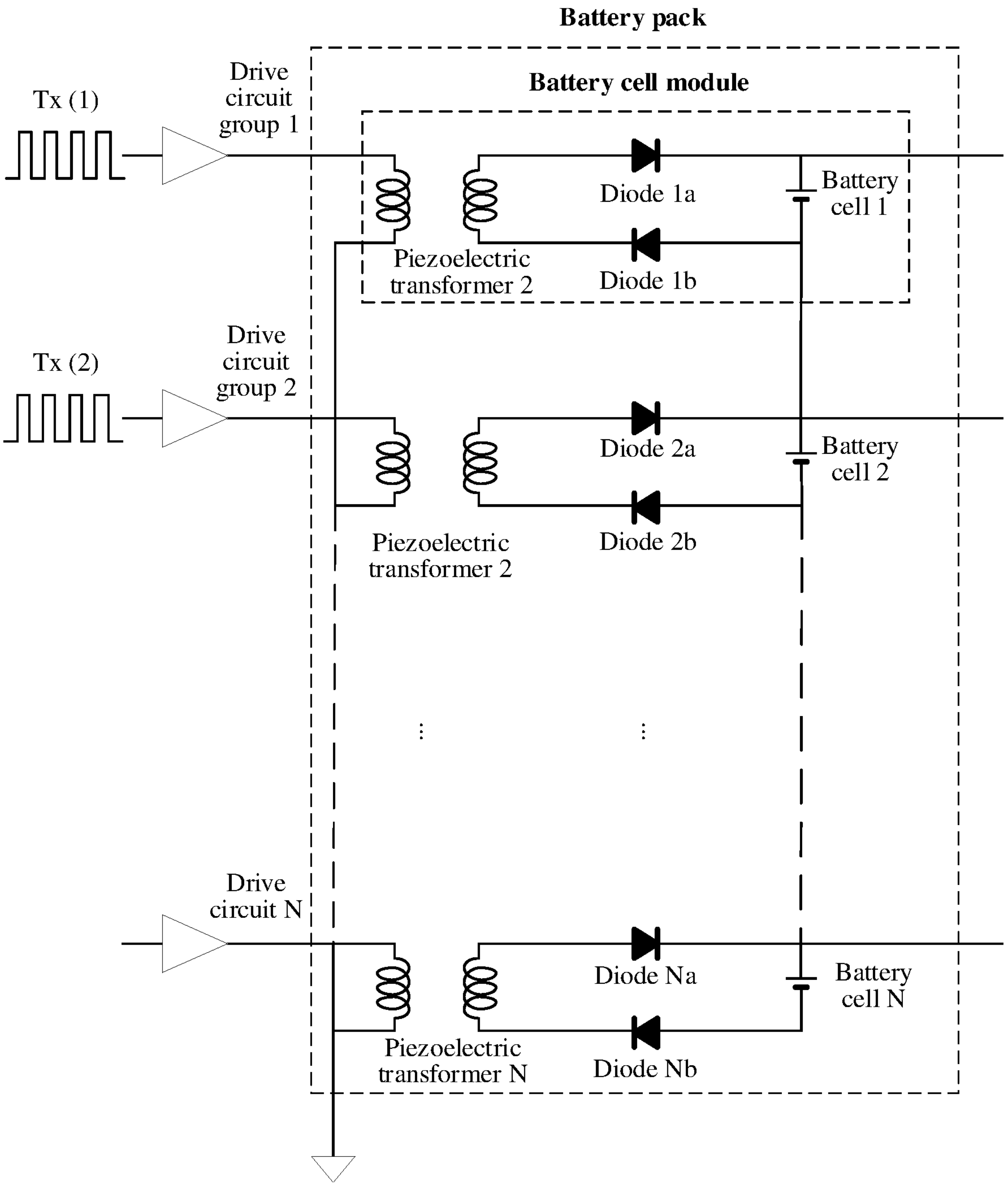
Figure 6B:
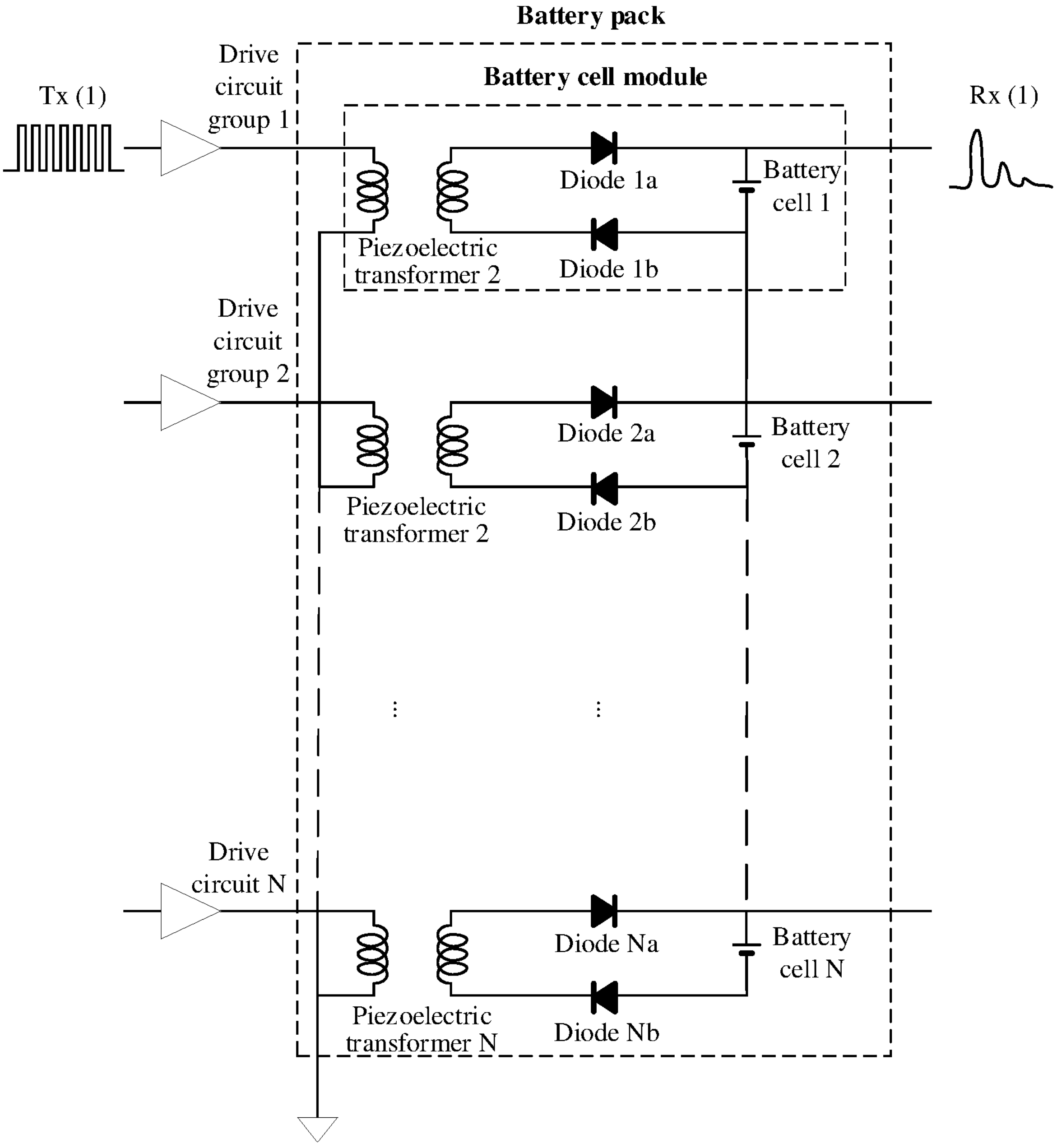

Optionally, FIG. 6*a* and FIG. 6*b* are schematic diagrams of working of a group of battery assisting apparatuses according to an embodiment. For circuit structures shown in FIG. 6*a* and FIG. 6*b*, refer to the description in the embodiment shown in FIG. 5. Details are not described herein again. Optionally, each drive circuit may include one or more metal-oxide semiconductor field-effect transistors (MOSFET), bipolar junction transistors (BJT), or the like. This is not limited in the embodiments. Optionally, as shown in FIG. 6*a* and FIG. 6*b*, the battery assisting apparatus may further include 2*N diodes, for example, a diode 1*a*, a diode 1*b*, a diode 2*a*, a diode 2*b*, . . . , a diode Na, and a diode Nb shown in FIG. 6*a* and FIG. 6*b*. An output end of each piezoelectric transformer may be connected to a corresponding battery cell by using two diodes. For example, the output end of the piezoelectric transformer 1 is connected to a battery cell 1 by using the diode 1*a* and the diode 1*b*, and the output end of the piezoelectric transformer 2 is connected to a battery cell 2 by using the diode 2*a* and the diode 2*b*. Details are not described herein again.

As shown in FIG. 6*a* and FIG. 6*b*, each battery cell and the piezoelectric transformer and the diode that correspond to the battery cell may form a battery cell module. The circuit structures shown in FIG. 6*a* and FIG. 6*b* may include N battery cell modules, and the N battery cell modules may further form battery packs shown in FIG. 6*a* and FIG. 6*b*. Optionally, the battery pack may further include the foregoing N drive circuits, other possible components such as a switch circuit, and a voltage detection circuit and a receiver circuit in subsequent embodiments. This is not limited in the embodiments.

Further, FIG. 7 is a schematic diagram of a structure of a piezoelectric transformer according to an embodiment. As shown in FIG. 7, each of the N piezoelectric transformers may include a first piezoelectric layer and a second piezoelectric layer, and the first piezoelectric layer and the second piezoelectric layer may be coupled by using an insulation layer. The first piezoelectric layer is connected to an input end of the piezoelectric transformer. The second piezoelectric layer may be connected to an output end of the piezoelectric transformer. As shown in FIG. 7, the second piezoelectric layer may be connected to an output end 1 and an output end 2. Refer to FIG. 6*a* or FIG. 6*b*. The output end 1 and the output end 2 may be respectively connected to two diodes in FIG. 6*a* or FIG. 6*b*.

It should be noted that thicknesses of the first piezoelectric layer and the second piezoelectric layer of the piezoelectric transformer in the embodiments are within a preset thickness range. A minimum value in the preset thickness range satisfies lowest conversion efficiency of the piezoelectric transformer, and a maximum value in the preset thickness range satisfies an ultrasonic wave generation condition. The lowest conversion efficiency can satisfy that the piezoelectric transformer outputs a plenty of electric energy driven by the first pulse signal to charge the battery cell, so that the voltages of the N battery cells are consistent, and the battery balancing is completed.

As described above, in the embodiments, the thicknesses of the first piezoelectric layer and the second piezoelectric layer in the piezoelectric transformer are optimized, so that the first piezoelectric layer and the second piezoelectric layer can satisfy the lowest conversion efficiency of the piezoelectric transformer required by the battery balancing, that is, a plenty of electric energy can be output to the corresponding battery cell through electric energy-mechanical energy-electric energy conversion between the first piezoelectric layer and the second piezoelectric layer, to ensure reliable and efficient battery balancing. The ultrasonic wave generation condition can also be satisfied, that is, after a high-frequency pulse signal is received, the first piezoelectric layer and the second piezoelectric layer can generate corresponding high-frequency vibrations, to transmit an ultrasonic wave. In this way, the piezoelectric transformer in the embodiments can satisfy working conditions of battery balancing and battery health detection, to greatly increase a reuse rate of a component (including, but not limited to, the piezoelectric transformer, and for example, a switch) in a circuit, reduce a circuit area, and significantly reduce overall production and manufacturing costs, and the like.

With reference to the circuit structures shown in FIG. 6*a* and FIG. 6*b* and the structure of the piezoelectric transformer shown in FIG. 7, the following describes in detail the battery assisting apparatus provided in the embodiments in terms of two working manners: battery balancing and battery health detection.

As shown in FIG. 6*a*, an example in which the battery assisting apparatus is used for battery balancing is used. When the voltages of the plurality of battery cells are not equal, for example, voltages of the battery cell 1 and the battery cell 2 are low, corresponding drive circuits (for example, the drive circuit 1 and the drive circuit 2) in the battery assisting apparatus may output first pulse signals to the piezoelectric transformers (for example, the piezoelectric transformer 1 and the piezoelectric transformer 2) that are correspondingly connected. As shown in FIG. 7, the piezoelectric transformer 1 and the piezoelectric transformer 2 may receive electric energy from the first pulse signals by using the first piezoelectric layers, and the first piezoelectric layers vibrate through an inverse piezoelectric effect. Vibration waves are coupled to the second piezoelectric layers by using mechanical structures between the first piezoelectric layers and the second piezoelectric layers. Then, the second piezoelectric layers generate electric energy through a direct piezoelectric effect, and output the electric energy to the battery cell 1 and the battery cell 2 that are correspondingly connected to charge the battery cell 1 and the battery cell 2, to complete the battery balancing. Optionally, the electric energy output by the piezoelectric transformers is an alternating current. Therefore, the diodes shown in FIG. 6*a* may be configured to rectify the alternating current output by the piezoelectric transformers, and only a direct current obtained after the rectification can reliably charge the battery cells.

As shown in FIG. 6*b*, an example in which the battery assisting apparatus is used for battery health detection is used. Each drive circuit (for example, the drive circuit 1, the drive circuit 2, . . . , and the drive circuit N) in the battery assisting apparatus may output a second pulse signal to a corresponding piezoelectric transformer (for example, the piezoelectric transformer 1, the piezoelectric transformer 2, . . . , and the piezoelectric transformer N). Correspondingly, driven by the high-frequency second pulse signal, the first piezoelectric layer and the second piezoelectric layer of each piezoelectric transformer will generate corresponding high-frequency vibrations, that is, generate an ultrasonic wave, and transmit the ultrasonic wave to a corresponding battery cell. Optionally, the ultrasonic waves may be transferred into the battery cell by using a series of media (for example, oil or glue) arranged between the piezoelectric transformer and the battery cell. As shown in FIG. 6*b*, after the ultrasonic wave may pass through the battery cell, the battery cell may reflect a corresponding echo. Then, as described above, the state of health of the battery cell may be directly and efficiently detected based on the time interval (or the echo delay) between the time point at which the piezoelectric transformer transmits the ultrasonic waves and the time point at which the battery cell reflects the echo. Details are not described herein again.

FIG. 8 is a schematic diagram of a structure of another battery assisting apparatus according to an embodiment. As shown in FIG. 8, the battery assisting apparatus may further include a digital processing circuit 304, a voltage detection circuit 305, and a receiver circuit 306. An output end of the digital processing circuit is connected to respective input ends of N drive circuits in the drive circuit group 301. The voltage detection circuit 305 is separately connected to the N battery cells in the battery string 303 and the digital processing circuit 304. The receiver circuit 306 is connected to the respective output ends of the N piezoelectric transformers in the piezoelectric transformer group 302. As shown in FIG. 8, the respective input ends of the N drive circuits in the drive circuit group 301 may be further connected to the battery string 303, and the N battery cells connected in series in the battery string 303 respectively supply electric energy to the N drive circuits (that is, voltages of pulse signals (for example, the first pulse signals and the second pulse signals) output by the drive circuits are voltages obtained by connecting the N battery cells in series), to drive and control the corresponding piezoelectric transformers.

The voltage detection circuit 305 may be configured to perform battery balancing, and the receiver circuit 306 may be configured to perform ultrasonic battery health detection. Optionally, some components (for example, an analog to digital converter) in the voltage detection circuit 305 and the receiver circuit 306 may be multiplexed. The following describes in detail the battery balancing and the ultrasonic battery health detection with reference to the structure shown in FIG. 8.

In one aspect, in a battery balancing operation, the voltage detection circuit 305 is configured to: detect respective voltage values of the N battery cells in the battery string 303, and send the respective voltage values of the N battery cells to the digital processing circuit 304. Optionally, the voltage detection circuit may include an analog to digital converter.

The digital processing circuit 304 is configured to: obtain an average voltage value of the N battery cells according to the respective voltage values of the N battery cells, and determine M battery cells from the N battery cells. The respective voltage values of the M battery cells may be less than the average voltage value of the N battery cells. The M battery cells are connected to the foregoing M piezoelectric transformers in a one-to-one correspondence. Subsequently, the M drive circuits, correspondingly connected to the M piezoelectric transformers, in the drive circuit group 301 may output, based on an instruction of the digital processing circuit, the first pulse signals to the M piezoelectric transformers, so that the M piezoelectric transformers transfer, driven by the first pulse signals, the electric energy to the corresponding battery cells for charging, to complete the battery balancing.

Optionally, duration for outputting the first pulse signal by each of the M drive circuits may be different. The digital processing circuit may calculate, according to a deviation between the voltage value of each of the M battery cells and the average voltage value, a time length of the first pulse signal that needs to be output by the corresponding drive circuit, that is, a time length that is required by the piezoelectric transformer to charge the corresponding battery cell. It can be understood that a smaller voltage value of the battery cell indicates a larger deviation from the average voltage value, and the drive circuit corresponding to the battery cell needs to output a first pulse signal with a larger time length, that is, the piezoelectric transformer needs to perform longer-time full charge on the battery cell. Correspondingly, a larger voltage value of the battery cell indicates a smaller deviation from the average voltage value, and the drive circuit corresponding to the battery cell needs to output a first pulse signal with a smaller time length, that is, the piezoelectric transformer needs to perform shorter-time proper charge on the battery cell, to accurately and efficiently achieve an objective of battery balancing.

Optionally, after charging is performed once, the voltage detection circuit 305 may detect respective voltage values of the N battery cells again. If the respective voltage values of the N battery cells are still no equal, or a deviation between a maximum voltage value and a minimum voltage value is greater than a preset value (for example, 0.1 V, 0.2 V, or 0.4 V), battery cells that need to be charged, corresponding charging durations (that is, the durations for outputting the first pulse signals), and the like are determined again according to the current respective voltage values of the N battery cells by using the digital processing circuit 304, to control the corresponding drive circuits and the corresponding piezoelectric transformers to charge the corresponding battery cells again until the respective voltage values of the N battery cells are equal, or a deviation between a maximum voltage value and a minimum voltage value is less than the preset value, to implement high-quality battery balancing, strictly ensuring reliability of battery balancing, and further ensuring a use experience of a user.

Optionally, the digital processing circuit 304 may include one or more microprocessors, a CPU, or the like, and is configured to perform analysis and computation. Optionally, the digital processing circuit 304 may be the power management module 104 or the processor 101 in the embodiment corresponding to FIG. 3, or may be the processor 213 in the embodiment corresponding to FIG. 4, or the like.

In another aspect, during ultrasonic battery health detection, the digital processing circuit 304 may be further configured to control the N drive circuits in the drive circuit group 301 to output high-frequency second pulse signals. Optionally, the digital processing circuit 304 may control the N drive circuits to simultaneously output the second pulse signals, to simultaneously implement health detection on the N battery cells, or may control the N drive circuits to output the second pulse signals in sequence, to implement health detection on the N battery cells in sequence. This is not limited in the embodiments. A manner may be determined according to an actual requirement and a circuit structure.

Each piezoelectric transformer in the piezoelectric transformer group 302 is configured to: under an action of the second pulse signal, generate high-frequency vibration with a corresponding frequency by using the first piezoelectric layer and the second piezoelectric layer in the piezoelectric transformer, to generate an ultrasonic wave, and transmit the ultrasonic wave to the correspondingly connected battery cell.

It should be noted that when generating the high-frequency vibration driven by the high-frequency pulse signal, each piezoelectric transformer in the piezoelectric transformer group 302 may still output certain electric energy (for example, a first electric signal) based on the piezoelectric effect described above. Since the high-frequency vibration may convert a large amount of electric energy, conversion efficiency of the piezoelectric transformer is extremely low during the ultrasonic battery health detection, and the electric energy may be converted into mechanical energy (that is, the generated ultrasonic wave) of the high-frequency vibration for consumption. Finally output electric energy is very weak, a charging effect of which on the battery cell can be ignored.

Correspondingly, when the echo reflected by the battery cell acts on the piezoelectric transformer, the first piezoelectric layer and the second piezoelectric layer in the piezoelectric transformer may further generate corresponding vibrations (that is, deformation). Therefore, the piezoelectric transformer may also output certain electric energy (for example, a second electrical signal) based on the piezoelectric effect described above.

The receiver circuit 306 is configured to: receive the first electrical signal generated when each piezoelectric transformer transmits the ultrasonic wave and the second electrical signal generated when each piezoelectric transformer receives the echo reflected by the corresponding battery cell. Optionally, the receiver circuit may include N amplifiers, an analog to digital converter, and the like. Respective input ends of the N amplifiers may be connected to the output ends of the N piezoelectric transformers in a one-to-one correspondence, and respective output ends of the N amplifiers may be connected to an input end of the analog to digital converter.

Optionally, each of the N amplifiers may be configured to: receive the first electrical signal and the second electrical signal that are generated by the piezoelectric transformer and amplify the first electrical signal and the second electrical signal. Then, the amplifier may output the amplified first electrical signal and the amplified second electrical signal to the analog to digital converter. Based on the amplifying effect of the amplifier on the electrical signals, accuracy of battery health detection can be effectively ensured, and impact, such as missing detection and false detection, on battery health detection caused by excessively weak electrical signals can be avoided.

The analog to digital converter is configured to: receive the amplified first electrical signal and the amplified second electrical signal, convert the amplified first electrical signal and the amplified second electrical signal into a corresponding first digital signal and a corresponding second digital signal, and then output the first digital signal and the second digital signal in sequence to the digital processing circuit. Optionally, the analog to digital converter in the receiver circuit 306 may use the analog to digital converter in the voltage detection circuit 305. This is not limited in the embodiments.

The digital processing circuit 304 is further configured to: determine, based on a time interval between time of receiving the first digital signal and time of receiving the second digital signal, an echo delay of the battery cell corresponding to each amplifier; and then determine a state of health of each battery cell based on the echo delay corresponding to each battery cell. In this way, health detection performed on the battery cell by using the ultrasonic wave generated by the piezoelectric transformer is completed. As described above, in the embodiments, the echo delay of each battery cell may be reliably and conveniently obtained based on the time interval (that is, the time interval between the first digital signal and the second digital signal) between the first electrical signal output when the piezoelectric transformer does the high-frequency vibration (that is, when the piezoelectric transformer generates the ultrasonic wave) and the second electrical signal output when the piezoelectric transformer vibrates driven by the action of the echo, to obtain the state of health of each battery cell. Therefore, compared with a solution in which an additional ultrasonic transmitter and a corresponding ultrasonic receiver need to be equipped in conventional ultrasonic battery health detection, the embodiments can implement efficient, accurate and convenient ultrasonic battery health detection by using the piezoelectric transformers with small volumes and light weights, and reduce a circuit area and a weight to an extremely large extent, to meet an actual requirement of a user.

Further, FIG. 9 is a schematic diagram of a circuit structure for battery balancing and battery health detection according to an embodiment. As shown in FIG. 9, an example is used, in which, the circuit structure may include a battery string including four battery cells, and corresponding four drive circuits, four piezoelectric transformers, four amplifiers, and one analog to digital converter.

As shown in FIG. 9, input ends of the drive circuit 1, the drive circuit 2, the drive circuit 3, and the drive circuit 4 are connected to the four battery cells connected in series. Based on this, the drive circuit 1, the drive circuit 2, the drive circuit 3, and the drive circuit 4 may output, under a high-voltage power supply provided by the plurality of battery cells connected in series, pulse signals (for example, first pulse signals and second pulse signals) respectively required for battery balancing and battery health detection. Voltages of the pulse signals are voltages obtained by connecting the four battery cells in series. In this way, in the embodiments, neither the battery balancing nor the battery health detection needs to be implemented by using an external power supply, to achieve objectives of energy-saving, lightweight and efficient battery balancing and battery health detection.

As shown in FIG. 9, output ends of the drive circuit 1, the drive circuit 2, the drive circuit 3, and the drive circuit 4 are connected to input ends of the piezoelectric transformer 1, the piezoelectric transformer 2, the piezoelectric transformer 3, and the piezoelectric transformer 4 in a one-to-one correspondence. Another input ends of the piezoelectric transformer 1, the piezoelectric transformer 2, the piezoelectric transformer 3, and the piezoelectric transformer 4 are grounded.

Further, two output ends of the piezoelectric transformer 1, the piezoelectric transformer 2, the piezoelectric transformer 3, and the piezoelectric transformer 4 are respectively connected to the battery cell 1, the battery cell 2, the battery cell 3, and the battery cell 4 in a one-to-one correspondence by using two diodes. For example, as shown in FIG. 9, the piezoelectric transformer 1 is correspondingly connected to the battery cell 1 by using a diode 1*a* and a diode 1*b*, and the piezoelectric transformer 2 is correspondingly connected to the battery cell 2 by using a diode 2*a* and a diode 2*b*. Details are not described herein again. As shown in FIG. 9, the two output ends of the piezoelectric transformer 1, the piezoelectric transformer 2, the piezoelectric transformer 3, and the piezoelectric transformer 4 are further connected to two input ends of the amplifier 1, the amplifier 2, the amplifier 3, and the amplifier 4 respectively in a one-to-one correspondence.

As shown in FIG. 9, output ends of the amplifier 1, the amplifier 2, the amplifier 3, and the amplifier 4 are respectively connected to the ADC by using corresponding switches. For example, as shown in FIG. 9, the amplifier 1 is connected to the ADC by using the switch 1*a*, and the amplifier 2 is connected to the ADC by using the switch 2*a*. Details are not described herein again.

As shown in FIG. 9, cathodes of the battery cell 1, the battery cell 2, the battery cell 3, and the battery cell 4 are respectively connected to the ADC by using the corresponding switches. For example, as shown in FIG. 9, the cathode of the battery cell 1 is connected to the ADC by using the switch 1*b*, and the battery cell 2 is connected to the ADC by using the switch 2*b*. Details are not described herein again.

It should be noted that in the battery balancing operation, the switch 1*b*, the switch 2*b*, the switch 3*b*, and the switch 4*b* may be turned on, and the switch 1*a*, the switch 2*a*, the switch 3*a*, and the switch 4*a* may be turned off. In the ultrasonic battery health detection operation, the switch 1*a*, the switch 2*a*, the switch 3*a*, and the switch 4*a* may be turned on, and the switch 1*b*, the switch 2*b*, the switch 3*b*, and the switch 4*b* may be turned off.

FIG. 10 is a schematic diagram of another circuit structure for battery balancing and battery health detection according to an embodiment. As shown in FIG. 10, the circuit structure may reflect a circuit structure corresponding to each battery cell. Each battery cell corresponds a high-voltage power supply (the high-voltage power supply is provided by a plurality of battery cells connected in series in a battery string), a drive circuit, a piezoelectric transformer, diodes, an amplifier, and an ADC that are connected in sequence. The high-voltage power supply, the drive circuit, the piezoelectric transformer, and the ADC shown in FIG. 10 are multiplexed in battery balancing and battery health detection, which improves a reuse rate of a component in a circuit to an extremely large extent, and effectively reduces a circuit area and production and manufacturing costs.

Based on the circuit structures shown in FIG. 9 and FIG. 10, the following further describes battery balancing and battery health detection in embodiments in detail by using examples of a plurality of cases.

(1) In a Battery Balancing Operation

First, respective voltage values of the battery cell 1, the battery cell 2, the battery cell 3, and the battery cell 4 are detected by using the ADC, which are, for example, 3 V, 3.2 V, 2.8 V, and 3 V respectively. Then, the ADC outputs the respective voltage values of the battery cell 1, the battery cell 2, the battery cell 3, and the battery cell 4 to the digital processing circuit (for example, a microprocessor, not shown in FIG. 9). The digital processing circuit obtains, through calculation based on the respective voltage values of the battery cell 1, the battery cell 2, the battery cell 3, and the battery cell 4, that an average voltage value of the four battery cells is 3 V, where the voltage value (2.8 V) of the battery cell 3 is less than the average value.

Then, the digital processing circuit may control the drive circuit 3 corresponding to the battery cell 3 to output the first pulse signal (12 V, that is, 3 V+3.2 V+2.8 V+3 V) for a period of time, to output, driven by the first pulse signal by using the corresponding piezoelectric transformer, the electric energy to the battery cell 3 for charging. In this way, active battery balancing of charging the battery cell 3 by using the four battery cells connected in series is implemented by using the piezoelectric transformer.

After the current charging is completed, respective voltage values of the battery cell 1, the battery cell 2, the battery cell 3, and the battery cell 4 may be detected again by using the ADC. If the voltage values are still not equal or a deviation is greater than a preset value, one or more battery cells with low voltages may be charged again, to ensure reliability of battery balancing. For example, after the current charging is completed, current respective voltage values of the battery cell 1, the battery cell 2, the battery cell 3, and the battery cell 4 are respectively 2.9 V, 3.1 V, 3 V, and 3 V. In this case, the average voltage value of the four battery cells is 3 V, where the voltage value (2.9 V) of the battery cell 1 is less than the average value. Then, the digital processing circuit may control the drive circuit 1 corresponding to the battery cell 1 to output the first pulse signal for a period of time, output, driven by the first pulse signal by using the corresponding piezoelectric transformer, the electric energy to the battery cell 1 for charging, and so on. The operation is repeated until the respective voltage values of the battery cell 1, the battery cell 2, the battery cell 3, and the battery cell 4 are equal or a deviation is less than the preset value. In this way, battery balancing is completed.

Optionally, in embodiments, a plurality of battery cells with low voltages may also be charged at the same time, to implement the battery balancing. For example, the current respective voltage values of the battery cell 1, the battery cell 2, the battery cell 3, and the battery cell 4 are 3.5 V, 3 V, 3 V, and 2.8 V respectively, and the voltage values of the battery cell 2, the battery cell 3, and the battery cell 4 are all less than the voltage value of the battery cell 1. In this case, the drive circuit 2, the drive circuit 3, and the drive circuit 4 may respectively output the first pulse signals of a period of time to the corresponding piezoelectric transformer 2, the corresponding piezoelectric transformer 3, and the corresponding piezoelectric transformer 4, to charge the battery cell 2, the battery cell 3, and the battery cell 4 respectively by using the piezoelectric transformer 2, the piezoelectric transformer 3, and the piezoelectric transformer 4. Optionally, sine the voltage values of both the battery cell 2 and the battery cell are 3 V, and the voltage value of the battery cell 4 is minimum, durations for outputting the first pulse signals by the drive circuit 2 and the drive circuit 3 may be consistent, and duration for outputting the first pulse signal by the drive circuit 4 may be the longest, to fully charge the battery cell 4. Thus, the voltages of the battery cell 1, the battery cell 2, the battery cell 3, and the battery cell 4 are consistent.

(2) In a Battery Health Detection Operation

As shown in FIG. 9, since the circuit structure includes only one ADC, a plurality of electrical signals cannot be processed at the same time. Therefore, battery health detection here can only be performed in sequence, and health detection cannot be performed on the four battery cells at the same time. Optionally, if the battery health detection needs to be simultaneously performed on a plurality of battery cells to improve a battery health detection efficiency, four ADCs connected to the four amplifiers in a one-to-one correspondence may be provided in the receiver circuit. This is not limited in embodiments.

The following takes health detection performed on the battery cell 1 in FIG. 9 as an example for description. First, a high-frequency second pulse signal is output to the piezoelectric transformer 1 by using the drive circuit 1. The first piezoelectric layer and the second piezoelectric layer in the piezoelectric transformer 1 generate corresponding high-frequency vibrations driven by the high-frequency second pulse signal, that is, generate an ultrasonic wave, and transmit the ultrasonic wave to the corresponding battery cell 1. At the same time, the piezoelectric transformer 1 outputs a first electrical signal to the amplifier 1. The amplifier 1 receives the first electrical signal and amplifies the first electrical signal. The amplifier then outputs the amplified first electrical signal to the ADC. The ADC receives the amplified first electrical signal, converts the amplified first electrical signal into a corresponding first digital signal, and then the ADC outputs the first digital signal to the digital processing circuit. Optionally, the digital processing circuit may record receiving time corresponding to the first digital signal. Optionally, the ADC may also record receiving time corresponding to the amplified first electrical signal.

Next, the battery cell 1 reflects a corresponding echo to the piezoelectric transformer 1. The first piezoelectric layer and the second piezoelectric layer in the piezoelectric transformer 1 vibrate under an action of the echo, and further output a second electrical signal to the amplifier 1. Correspondingly, the amplifier 1 receives the second electrical signal and amplifies the second electrical signal, and then the amplifier outputs the amplified second electrical signal to the ADC. The ADC receives the amplified second electrical signal, converts the amplified second electrical signal into a corresponding second digital signal, and then the ADC outputs the second digital signal to the digital processing circuit. Optionally, the digital processing circuit may record receiving time corresponding to the second digital signal. Optionally, the ADC may also record receiving time corresponding to the amplified second electrical signal.

Finally, the digital processing circuit may determine, based on a time interval between time of receiving the second digital signal and time of receiving the first digital signal (or based on a time interval between a time point at which the analog to digital converter receives the amplified second electrical signal and a time point at which the analog to digital converter receives the amplified first electrical signal), an echo delay corresponding to the battery cell 1, and determine a state of health of the battery cell 1 based on the echo delay corresponding to the battery cell 1. As described above, a shorter echo delay indicates that the battery cell has not expanded (that is, has not been aged), and the state of health of the battery cell is better. A longer echo delay indicates that the battery cell has expanded (that is, has started aging or been severely aged), and the state of health of the battery cell is poorer.

It can be understood that the health detection of other battery cells is similar, and details are not described herein again.

In conclusion, in the embodiments, a conventional piezoelectric sensor is optimized, and the optimized piezoelectric sensor is used to replace a conventional magnetic-core transformer to perform the battery balancing. In addition, the optimized piezoelectric sensor is used to replace a conventional ultrasonic sensor to perform the battery health detection. On the one hand, based on advantages of a small volume, a lightweight, and a high conversion efficiency of the piezoelectric transformer, in the embodiments, a circuit area occupied by the battery balancing and a weight can be greatly reduced, to implement lightweight and efficient battery balancing. On the other hand, likewise, based on the advantages of the small volume and the lightweight of the piezoelectric transformer, in the embodiments, a circuit area occupied by the battery health detection and a weight can also be greatly reduced, to implement simple, convenient, and efficient battery health detection. Further, as described above, in embodiments, the same piezoelectric transformer can be used to implement both the battery balancing and the battery health detection. Therefore, in the embodiments, a reuse rate of a component (including, but not limited to, the piezoelectric transformer) in a circuit is further greatly increased, and a circuit area overall and a weight occupied by the battery balancing and the battery health detection can be reduced to an extremely large extent. Correspondingly, overall production and manufacturing costs of the electronic device are significantly reduced, and a development trend of lightweight electronic devices and a user requirement are met.

FIG. 11 is a schematic flowchart of a battery assisting method according to an embodiment. The battery assisting method maybe applied to an electronic device (for example, the electronic device 100 shown in FIG. 3, or the electric vehicle 200 shown in FIG. 4). The electronic device includes a battery string, a piezoelectric transformer group and a drive circuit group. The piezoelectric transformer group includes N piezoelectric transformers. The drive circuit group includes N drive circuits. Respective output ends of the N drive circuits are connected to respective input ends of the N piezoelectric transformers in a one-to-one correspondence. Respective output ends of the N piezoelectric transformers are connected to N battery cells in the battery string in a one-to-one correspondence, where N is an integer greater than 1. The battery assisting method may include following step S401 to step S402.

Step S401: Respectively output first pulse signals to M piezoelectric transformers in the N piezoelectric transformers by using M drive circuits in the N drive circuits, where M is a positive integer less than N.

Step S402: Receive the first pulse signal by using each of the M piezoelectric transformers, and output, driven by the first pulse signal, electric energy to the battery cell corresponding to each piezoelectric transformer for charging, so that voltages of the N battery cells are consistent.

In some possible implementations, the method further includes: respectively outputting second pulse signals to the N piezoelectric transformers by using the N drive circuits, where a frequency of the second pulse signal is greater than a frequency of the first pulse signal; receiving the second pulse signal by using each of the N piezoelectric transformers, and generating an ultrasonic wave driven by the second pulse signal; and detecting a state of health of the battery cell corresponding to each piezoelectric transformer by using the ultrasonic wave.

In some possible implementations, the electronic device further includes a voltage detection circuit and a digital processing circuit. An output end of the digital processing circuit is connected to respective input ends of the N drive circuits. The voltage detection circuit is separately connected to the N battery cells and the digital processing circuit. The method further includes:

detecting respective voltage values of the N battery cells by using the voltage detection circuit, and sending the respective voltage values of the N battery cells to the digital processing circuit; and obtaining an average voltage value of the N battery cells according to the respective voltage values of the N battery cells by using the digital processing circuit, and determining the M battery cells from the N battery cells, where respective voltage values of the M battery cells are less than the average voltage value of the N battery cells, and the M piezoelectric transformers are connected to the M battery cells in a one-to-one correspondence.

In some possible implementations, each of the N piezoelectric transformers includes a first piezoelectric layer and a second piezoelectric layer. The first piezoelectric layer and the second piezoelectric layer are coupled by using an insulation layer. The first piezoelectric layer is connected to the input end of the piezoelectric transformer, and the second piezoelectric layer is connected to the output end of the piezoelectric transformer.

Thicknesses of the first piezoelectric layer and the second piezoelectric layer are within a preset thickness range. A minimum value in the preset thickness range satisfies lowest conversion efficiency of the piezoelectric transformer, and a maximum value in the preset thickness range satisfies an ultrasonic wave generation condition. The lowest conversion efficiency satisfies that the voltages of the N battery cells are consistent driven by the first pulse signals.

In some possible implementations, the receiving the second pulse signal by using each of the N piezoelectric transformers, and generating an ultrasonic wave driven by the second pulse signal includes:

generating the ultrasonic wave through high-frequency vibrations generated by the first piezoelectric layer and the second piezoelectric layer of each of the N piezoelectric transformers driven by the second pulse signal, and transmitting the ultrasonic wave to the battery cell corresponding to each piezoelectric transformer.

In some possible implementations, the respective input ends of the N drive circuits are connected to the battery string, and voltages of the first pulse signals and voltages of the second pulse signals are voltages of the N battery cells connected in series.

In some possible implementations, the electronic device further includes a receiver circuit. The receiver circuit is separately connected to the piezoelectric transformer group and the digital processing circuit. The method further includes:

receiving, by using the receiver circuit, a first electrical signal generated when each piezoelectric transformer transmits the ultrasonic wave and a second electrical signal generated when each piezoelectric transformer receives the echo reflected by the corresponding battery cell; and determining a state of health of each battery cell based on an echo delay of each battery cell by using the digital processing circuit, where the echo delay is a time interval between a time point at which the receiver circuit receives the first electrical signal and a time point at which the receiver circuit receives the second electrical signal.

In some possible implementations, the receiver circuit includes an amplifier group and an analog to digital converter. The amplifier group includes N amplifiers. Respective input ends of the N amplifiers are connected to the respective output ends of the N piezoelectric transformers in a one-to-one correspondence. Respective output ends of the N amplifiers are connected to an input end of the analog to digital converter. An output end of the analog to digital converter is connected to the digital processing circuit. The receiving, by the receiver circuit, a first electrical signal generated when each piezoelectric transformer transmits the ultrasonic wave and a second electrical signal generated when each piezoelectric transformer receives the echo reflected by the corresponding battery cell includes:

receiving, by using each of the N amplifiers, the first electrical signal and the second electrical signal that are generated in sequence by the piezoelectric transformer corresponding to each amplifier, amplifying the first electrical signal and the second electrical signal, and outputting the amplified first electrical signal and the amplified second electrical signal to the analog to digital converter in sequence; and converting the amplified first electrical signal and the amplified second electrical signal into a corresponding first digital signal and a corresponding second digital signal by using the analog to digital converter and outputting the first digital signal and the second digital signal to the digital processing circuit in sequence.

Optionally, for details of the battery assisting method, refer to the descriptions of the embodiments corresponding to FIG. 3 to FIG. 10. Details are not described herein again.

Optionally, all method procedures in the battery assisting method described in the embodiments may be implemented based on software, hardware, or a combination thereof. The hardware-based implementation may include a logic circuit, an algorithm circuit, an analog circuit, or the like. The software-based implementation may include program instructions, may be considered as a software product, stored in a memory, and may be run by a processor to implement related functions.

An embodiment may further provide a non-transitory computer readable storage medium. The non-transitory computer readable storage medium may store a program. When the program is executed by a processor, the processor is enabled to perform some or all of the steps recorded in any one of the foregoing method embodiments.

An embodiment may further provide a computer program. The computer program includes instructions. When the computer program is executed by a multi-core processor, the processor is enabled to perform some or all of the steps recorded in any one of the foregoing method embodiments.

In the foregoing embodiments, the description of each embodiment has respective focuses. For a part that is not described in detail in an embodiment, reference may be made to related descriptions in other embodiments. It should be noted that, for brief description, the foregoing method embodiments are represented as a series of action combinations. However, persons skilled in the art should appreciate that the embodiments may not be limited to the described order of the actions, because some steps may be performed in other orders or simultaneously. It should be further appreciated by persons skilled in the art that the involved actions and modules are not necessarily required by the embodiments.

In the several embodiments, it should be understood that the apparatus may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic or other forms.

The foregoing units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in the embodiments may be integrated into one processing unit, or each of the units may exist alone physically, or two or more units are integrated into one unit. The integrated unit may be implemented in a form of hardware or may be implemented in a form of a software function unit.

When the foregoing integrated unit is implemented in the form of a software functional unit and sold or used as an independent product, the integrated unit may be stored in a non-transitory computer-readable storage medium. Based on such an understanding, the embodiments may be implemented in the form of a software product. The software product is stored in a storage medium and includes several instructions for instructing a computer device (which may be a personal computer, a server, or a network device) to perform all or some of the steps of the methods described in embodiments of this application. The foregoing storage medium may include: any medium that can store program code, such as a USB flash drive, a removable hard disk, a magnetic disk, an optical disc, a read-only memory (ROM), a double rate synchronous dynamic random access memory (DDR), a flash memory (flash), or a random access memory (RAM).

The foregoing embodiments are merely intended for describing the embodiments, but not for limiting. Although described in detail with reference to the foregoing embodiments, persons of ordinary skill in the art should understand that they may still make modifications to the solutions described in the foregoing embodiments or make equivalent replacements to some features thereof, without departing from the spirit and scope of the embodiments.

What is claimed is:

1. A battery assisting apparatus comprising:

a piezoelectric transformer group, wherein the piezoelectric transformer group comprises N piezoelectric transformers; and a drive circuit group, wherein the drive circuit group comprises N drive circuits; respective output ends of the N drive circuits are connected to respective input ends of the N piezoelectric transformers in a one-to-one correspondence; and respective output ends of the N piezoelectric transformers are connected to N battery cells in a battery string in a one-to-one correspondence, wherein N is an integer greater than 1;

M drive circuits in the N drive circuits are configured to respectively output first pulse signals to M piezoelectric transformers in the N piezoelectric transformers, wherein Mis a positive integer less than N; and each of the M piezoelectric transformers is configured to receive the first pulse signal, and output, driven by the first pulse signal, electric energy to the battery cell corresponding to each piezoelectric transformer for charging, so that voltages of the N battery cells are consistent, wherein the N drive circuits are further configured to output second pulse signals to the N piezoelectric transformers respectively, wherein a frequency of the second pulse signal is greater than a frequency of the first pulse signal; and each of the N piezoelectric transformers is configured to: receive the second pulse signal, and generate an ultrasonic wave driven by the second pulse signal, wherein the ultrasonic wave is used to detect a state of health of the battery cell corresponding to each piezoelectric transformer.

2. The battery assisting apparatus according to claim 1, further comprising:

a voltage detection circuit; and a digital processing circuit, wherein an output end of the digital processing circuit is connected to respective input ends of the N drive circuits; and the voltage detection circuit is separately connected to the N battery cells and the digital processing circuit;

the voltage detection circuit is configured to: detect respective voltage values of the N battery cells, and send the respective voltage values of the N battery cells to the digital processing circuit; and the digital processing circuit is configured to determine M battery cells from the N battery cells based on the respective voltage values of the N battery cells, wherein respective voltage values of the M battery cells are less than a minimum voltage value among voltage values of N-M battery cells; the N-M battery cells belong to the N battery cells; and the M piezoelectric transformers are connected to the M battery cells in a one-to-one correspondence.

3. The battery assisting apparatus of claim 2, wherein the digital processing circuit is further configured to obtain an average voltage value of the N battery cells according to the respective voltage values of the N battery cells, and determine the M battery cells from the N battery cells such that the respective voltage values of the M battery cells are less than the average voltage value of the N battery cells.

4. The battery assisting apparatus according to claim 1, wherein each of the N piezoelectric transformers comprises a first piezoelectric layer and a second piezoelectric layer; the first piezoelectric layer and the second piezoelectric layer are coupled by using an insulation layer; the first piezoelectric layer is connected to the input end of the piezoelectric transformer, and the second piezoelectric layer is connected to the output end of the piezoelectric transformer; and the N piezoelectric transformers are configured to:

generate the ultrasonic wave through high-frequency vibrations generated by the first piezoelectric layer and the second piezoelectric layer of each of the N piezoelectric transformers driven by the second pulse signal, and transmit the ultrasonic wave to the battery cell corresponding to each piezoelectric transformer.

5. The battery assisting apparatus according to claim 4, wherein thicknesses of the first piezoelectric layer and the second piezoelectric layer are within a preset thickness range; a minimum value in the preset thickness range satisfies lowest conversion efficiency of the piezoelectric transformer, and a maximum value in the preset thickness range satisfies an ultrasonic wave generation condition; and the lowest conversion efficiency satisfies that the voltages of the N battery cells are consistent driven by the first pulse signals.

6. The battery assisting apparatus according to claim 1, wherein the respective input ends of the N drive circuits are connected to the battery string, and voltages of the first pulse signals and voltages of the second pulse signals are voltages of the N battery cells connected in series.

7. The battery assisting apparatus according to claim 1, further comprising:

a receiver circuit separately connected to the piezoelectric transformer group and the digital processing circuit, wherein the receiver circuit is configured to: receive a first electrical signal generated when each piezoelectric transformer transmits the ultrasonic wave and a second electrical signal generated when each piezoelectric transformer receives an echo reflected by the corresponding battery cell; and transmit the first electrical signal and the second electrical signal to the digital processing circuit; and the digital processing circuit is further configured to determine the state of health of each battery cell based on an echo delay of each battery cell, wherein the echo delay is a time interval between a time point at which the receiver circuit receives the first electrical signal and a time point at which the receiver circuit receives the second electrical signal.

8. The battery assisting apparatus according to claim 7, wherein the receiver circuit further comprises:

an amplifier group; and an analog to digital converter; the amplifier group comprises N amplifiers; respective input ends of the N amplifiers are connected to the respective output ends of the N piezoelectric transformers in a one-to-one correspondence; respective output ends of the N amplifiers are connected to an input end of the analog to digital converter; and an output end of the analog to digital converter is connected to the digital processing circuit;

each of the N amplifiers is configured to: receive the first electrical signal and the second electrical signal that are generated in sequence by the piezoelectric transformer corresponding to each amplifier, amplify the first electrical signal and the second electrical signal, and output the amplified first electrical signal and the amplified second electrical signal to the analog to digital converter in sequence;

the analog to digital converter is configured to: convert the amplified first electrical signal and the amplified second electrical signal into a corresponding first digital signal and a corresponding second digital signal, and output the first digital signal and the second digital signal to the digital processing circuit in sequence; and the digital processing circuit is configured to determine, based on the first digital signal and the second digital signal that are received in sequence, the echo delay of the battery cell corresponding to each amplifier.

9. A battery pack, comprising:

the battery assisting apparatus of claim 1; and the battery string recited in claim 1.

10. An automobile, comprising:

a charging interface;

a battery assembly; and a powertrain, wherein the battery assembly comprises the battery pack of claim 9, and the powertrain comprises a motor and a transmission.

11. A battery assisting method, applied to an electronic device, wherein the electronic device comprises a piezoelectric transformer group and a drive circuit group; the piezoelectric transformer group comprises N piezoelectric transformers; the drive circuit group comprises N drive circuits; respective output ends of the N drive circuits are connected to respective input ends of the N piezoelectric transformers in a one-to-one correspondence; respective output ends of the N piezoelectric transformers are connected to N battery cells in a battery string in a one-to-one correspondence, wherein N is an integer greater than 1; and the method comprises:

respectively outputting first pulse signals to M piezoelectric transformers in the N piezoelectric transformers by using M drive circuits in the N drive circuits, wherein Mis a positive integer less than N;

receiving the first pulse signal by using each of the M piezoelectric transformers, and outputting, driven by the first pulse signal, electric energy to the battery cell corresponding to each piezoelectric transformer for charging, so that voltages of the N battery cells are consistent;

respectively outputting second pulse signals to the N piezoelectric transformers by using the N drive circuits, wherein a frequency of the second pulse signal is greater than a frequency of the first pulse signal;

receiving the second pulse signal by using each of the N piezoelectric transformers, and generating an ultrasonic wave driven by the second pulse signal; and detecting a state of health of the battery cell corresponding to each piezoelectric transformer by using the ultrasonic wave.

* * * * *